United States Patent
Shen et al.

(10) Patent No.: US 12,002,716 B2
(45) Date of Patent: *Jun. 4, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Shu-Wen Shen, Hsinchu (TW); Chen-Ping Chen, Toucheng Township (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 18/120,902

(22) Filed: Mar. 13, 2023

(65) Prior Publication Data

US 2023/0215933 A1    Jul. 6, 2023

Related U.S. Application Data

(63) Continuation of application No. 17/368,496, filed on Jul. 6, 2021, now Pat. No. 11,605,727.

(Continued)

(51) Int. Cl.
*H01L 21/8234*    (2006.01)
*H01L 29/06*    (2006.01)

(Continued)

(52) U.S. Cl.
CPC ........... *H01L 21/823481* (2013.01); *H01L 21/823412* (2013.01); *H01L 21/823431* (2013.01);

(Continued)

(58) Field of Classification Search
CPC ..... H01L 21/823412; H01L 21/823431; H01L 21/823437; H01L 21/823468;

(Continued)

(56) References Cited

U.S. PATENT DOCUMENTS

2016/0163833 A1    6/2016    He et al.

OTHER PUBLICATIONS

Notice of Allowance issued in U.S. Appl. No. 17/368,496, dated Nov. 10, 2022.

*Primary Examiner* — Cheung Lee
(74) *Attorney, Agent, or Firm* — STUDEBAKER & BRACKETT PC

(57) ABSTRACT

In a method of manufacturing a semiconductor device, a fin structure including a stacked layer of first and second semiconductor layers and a hard mask layer over the stacked layer is formed. A sacrificial cladding layer is formed over at least sidewalls of the exposed hard mask layer and stacked layer. An etching is performed to remove lateral portions of the sacrificial cladding layer, thereby leaving the sacrificial cladding layer on sidewalls of the exposed hard mask layer and stacked layer. A first dielectric layer and a second dielectric layer made of a different material than the first dielectric layer are formed. The second dielectric layer is recessed, and a third dielectric layer made of a different material than the second dielectric layer is formed on the recessed second dielectric layer. During the etching operation, a protection layer is formed over the sacrificial cladding layer.

20 Claims, 38 Drawing Sheets

Related U.S. Application Data

(60) Provisional application No. 63/168,795, filed on Mar. 31, 2021.

(51) Int. Cl.
  *H01L 29/423* (2006.01)
  *H01L 29/66* (2006.01)
  *H01L 29/78* (2006.01)
  H01L 29/775 (2006.01)
  H01L 29/786 (2006.01)

(52) U.S. Cl.
  CPC .. *H01L 21/823437* (2013.01); *H01L 29/0665* (2013.01); *H01L 29/42392* (2013.01); *H01L 29/66439* (2013.01); *H01L 29/6653* (2013.01); *H01L 29/66545* (2013.01); *H01L 29/66553* (2013.01); *H01L 29/6656* (2013.01); *H01L 29/66795* (2013.01); *H01L 29/7851* (2013.01); H01L 29/0673 (2013.01); H01L 29/775 (2013.01); H01L 29/78696 (2013.01)

(58) Field of Classification Search
  CPC ......... H01L 21/823481; H01L 29/0665; H01L 29/0673; H01L 29/165; H01L 29/42392; H01L 29/66439; H01L 29/6653; H01L 29/66545; H01L 29/66553; H01L 29/6656; H01L 29/66795; H01L 29/775; H01L 29/7848; H01L 29/785; H01L 29/7851; H01L 29/78696; B82Y 10/00
  See application file for complete search history.

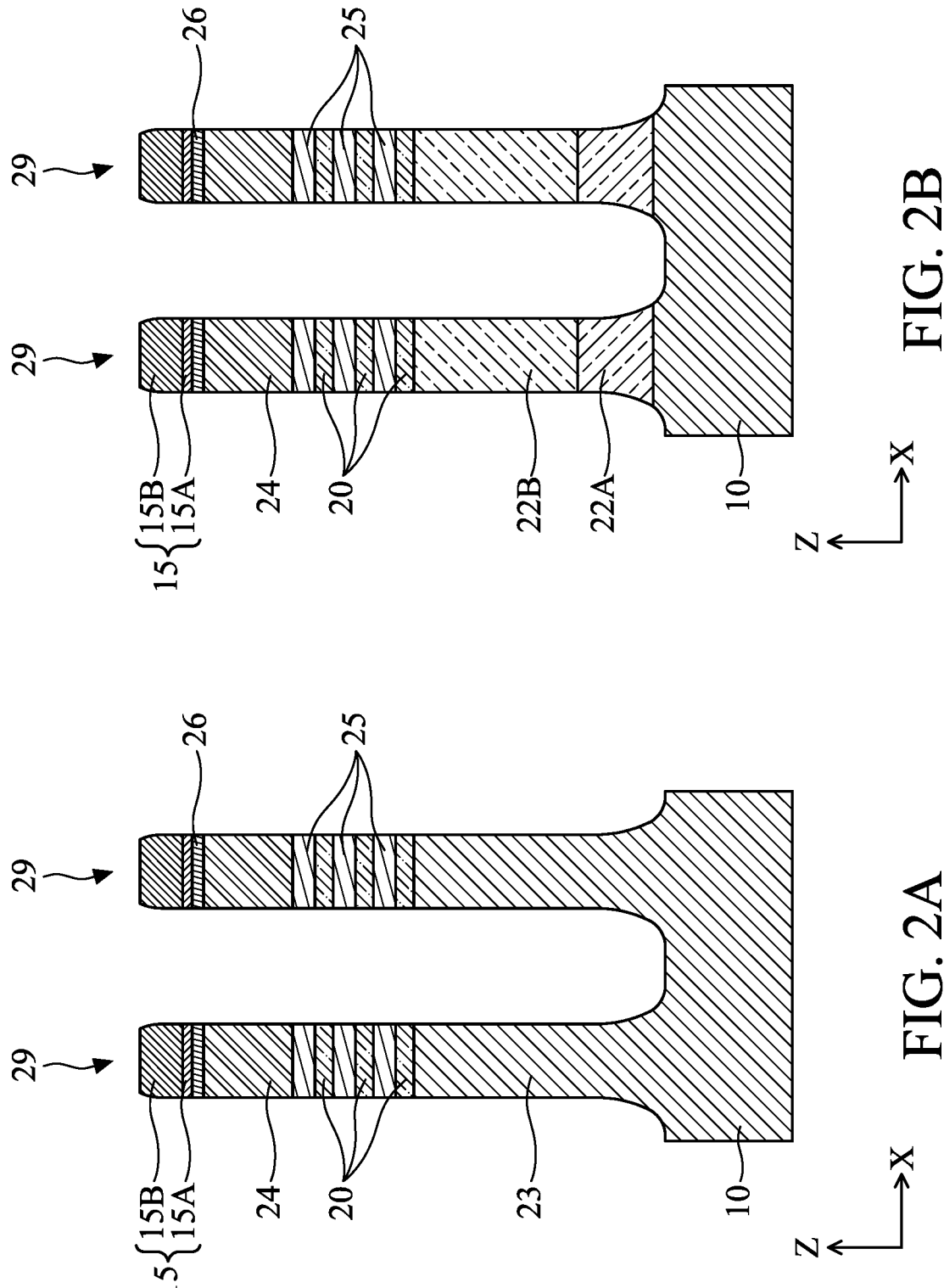

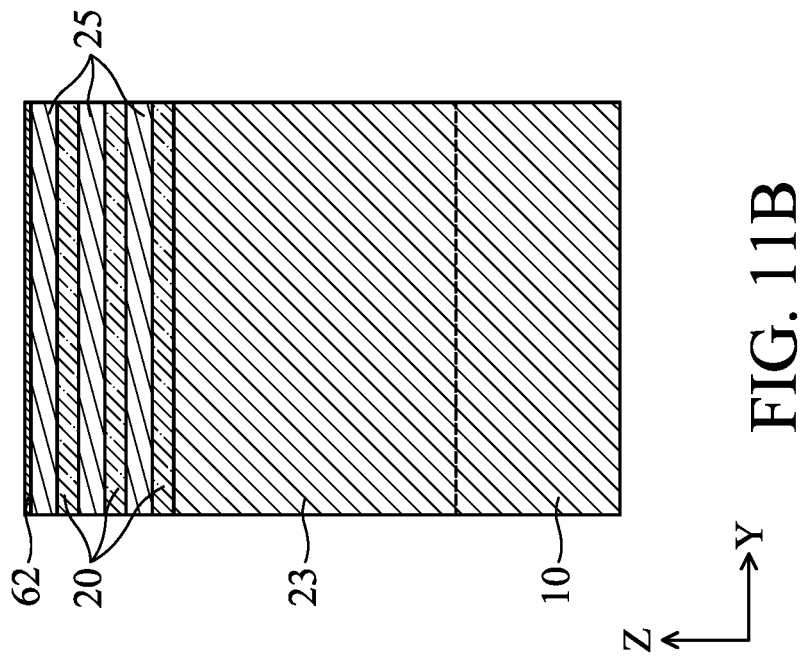
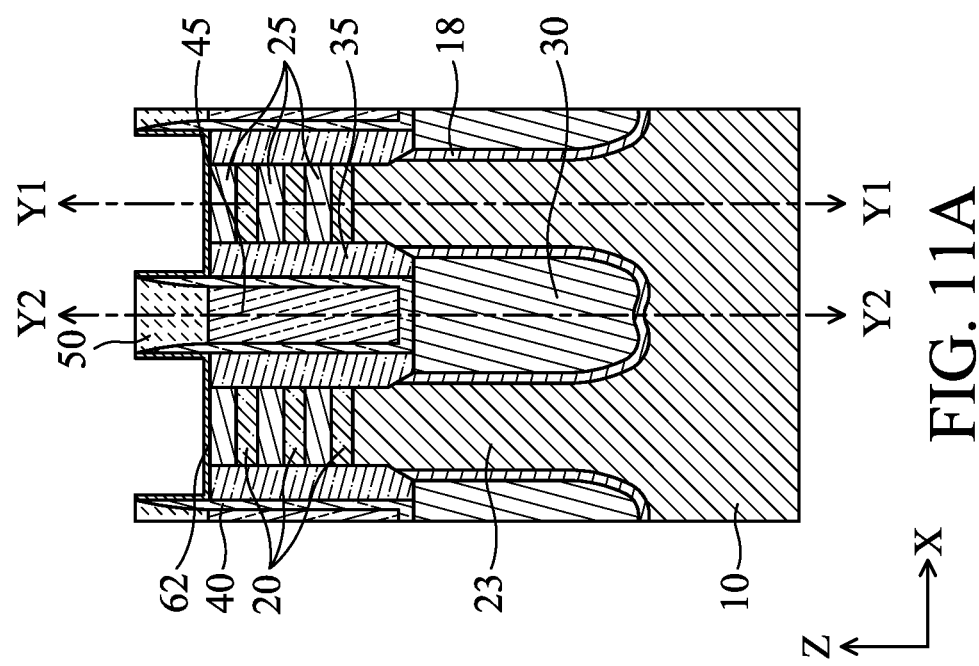
FIG. 11B
FIG. 11A

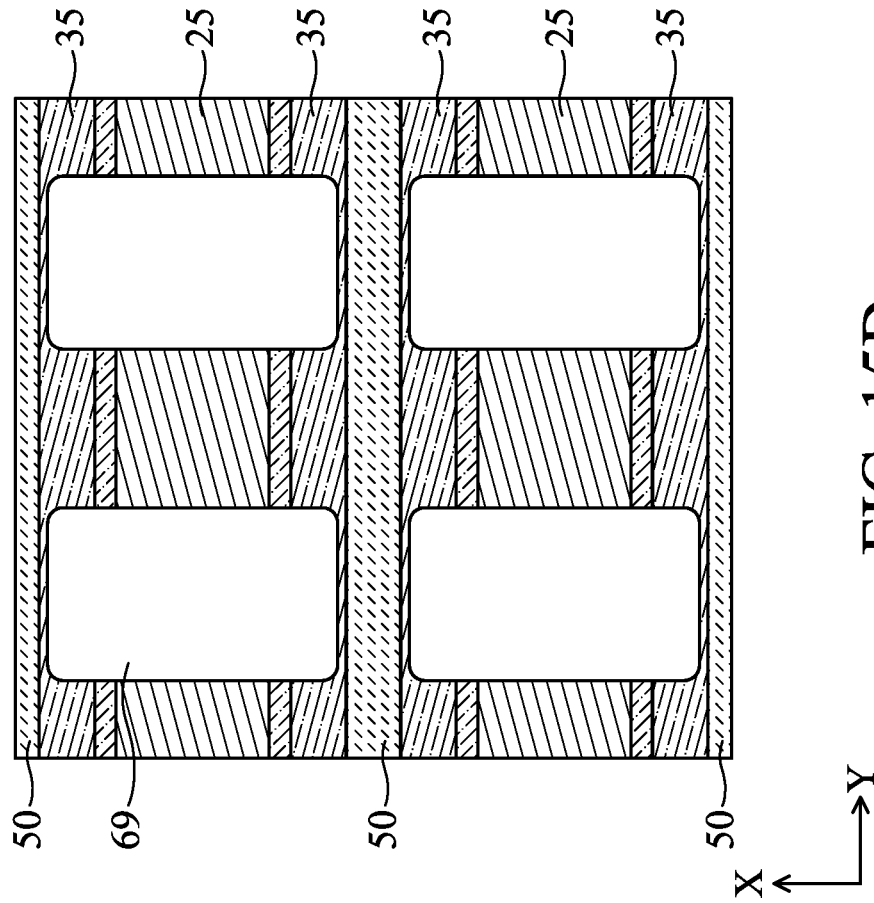
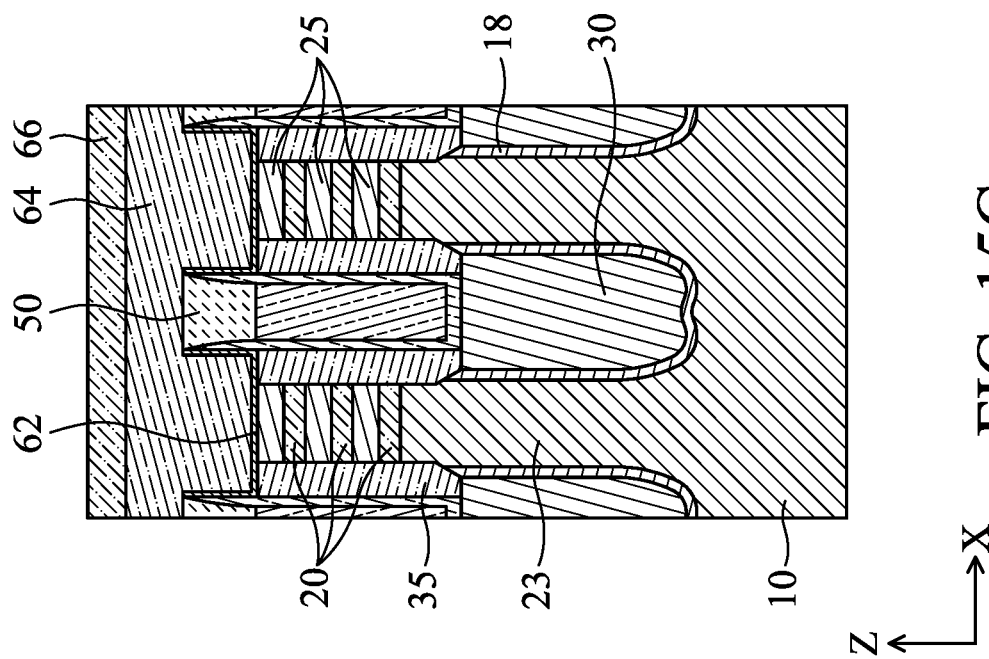
FIG. 15C
FIG. 15D

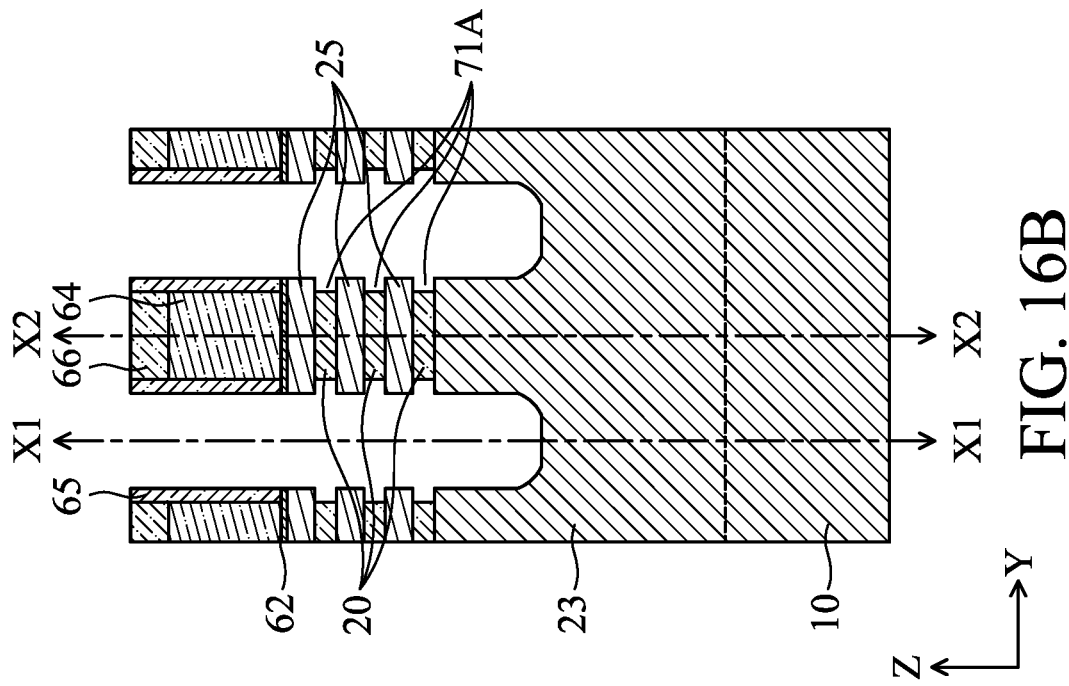
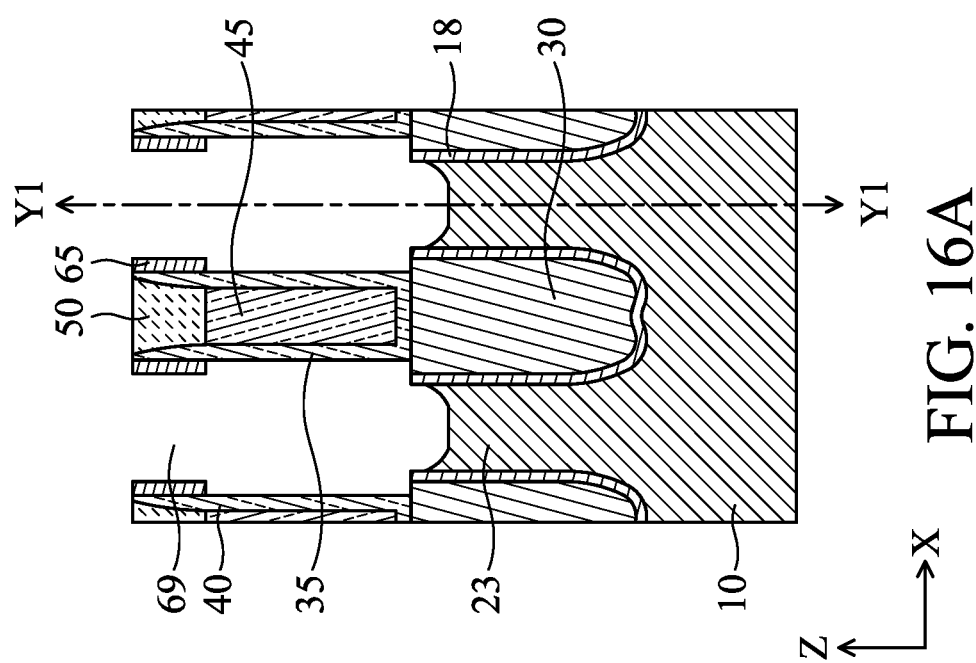
FIG. 16B
FIG. 16A

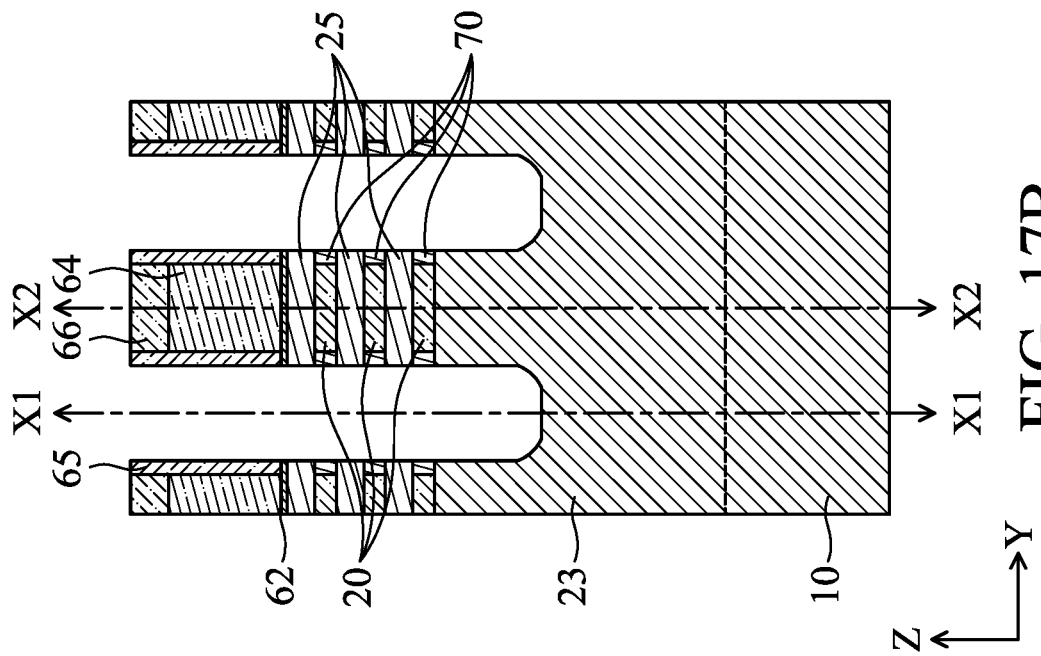
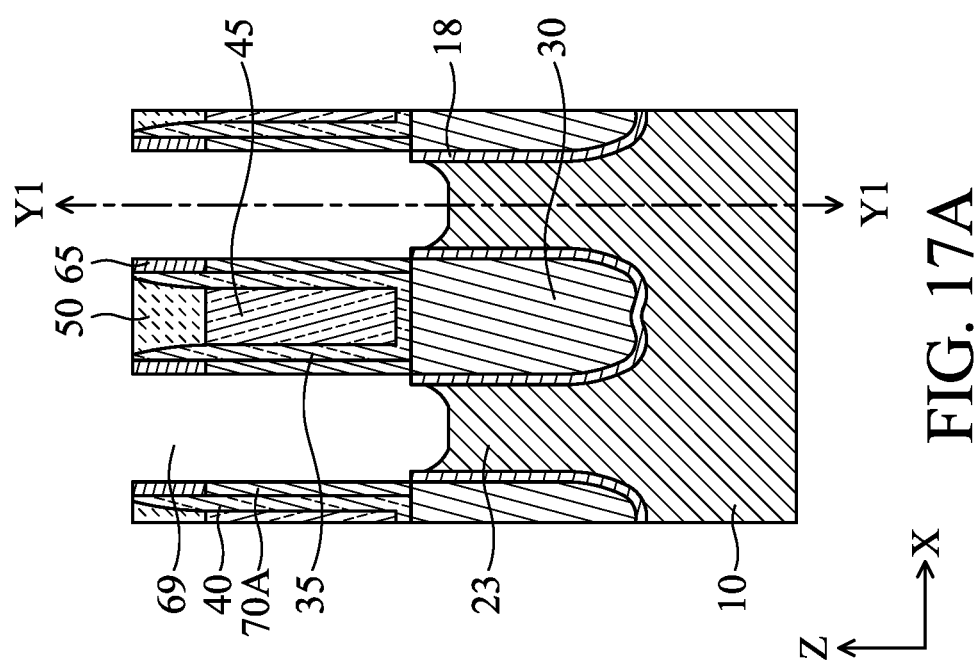
FIG. 17A
FIG. 17B

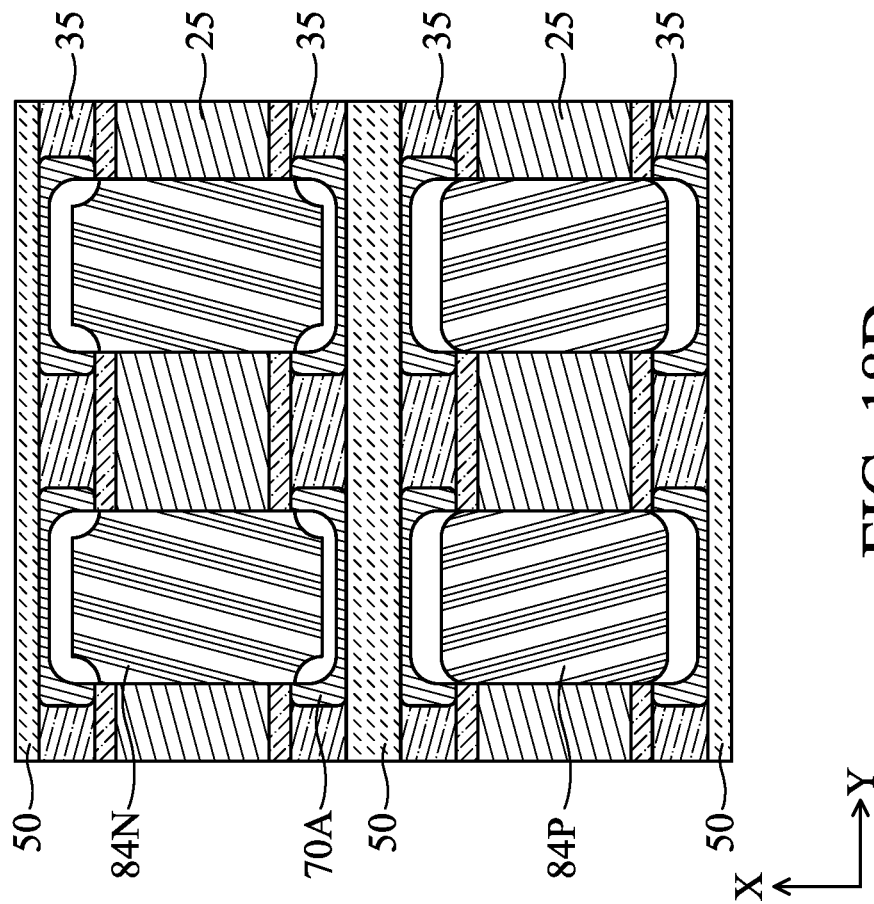
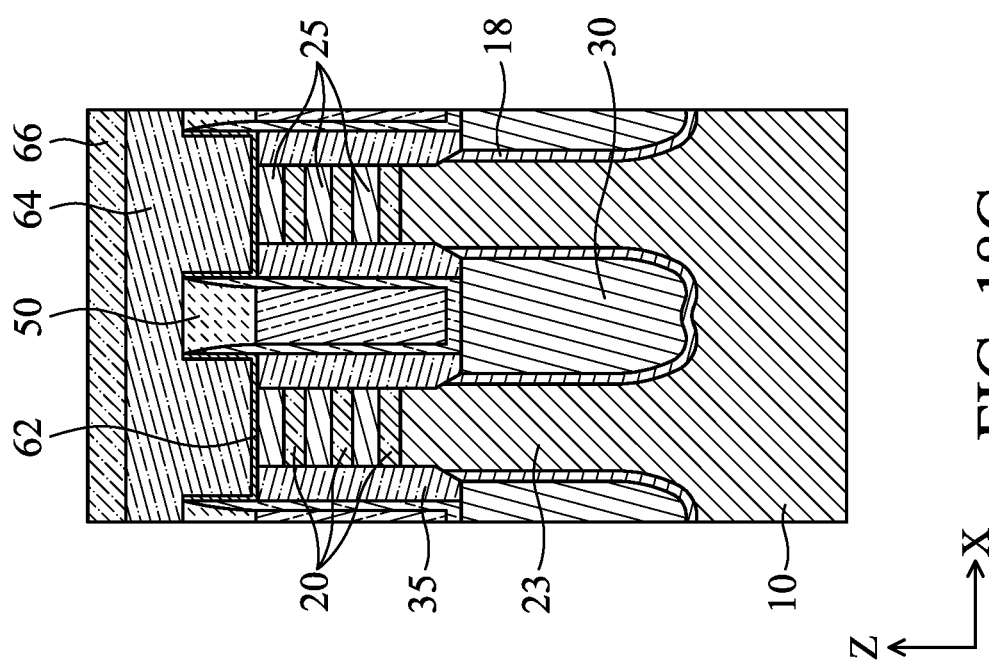
FIG. 18D
FIG. 18C

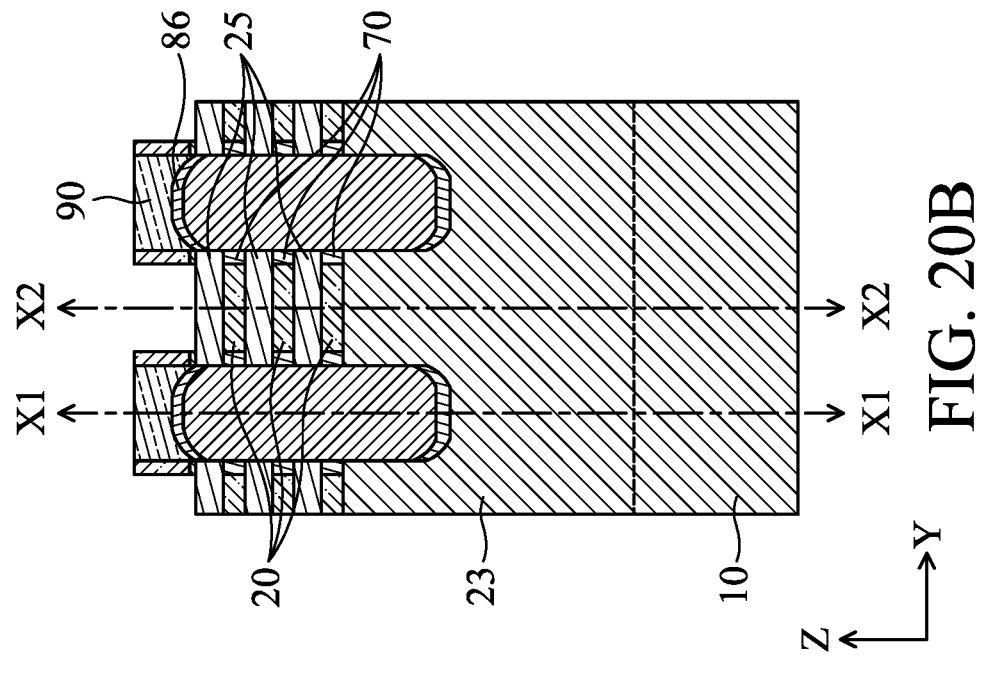
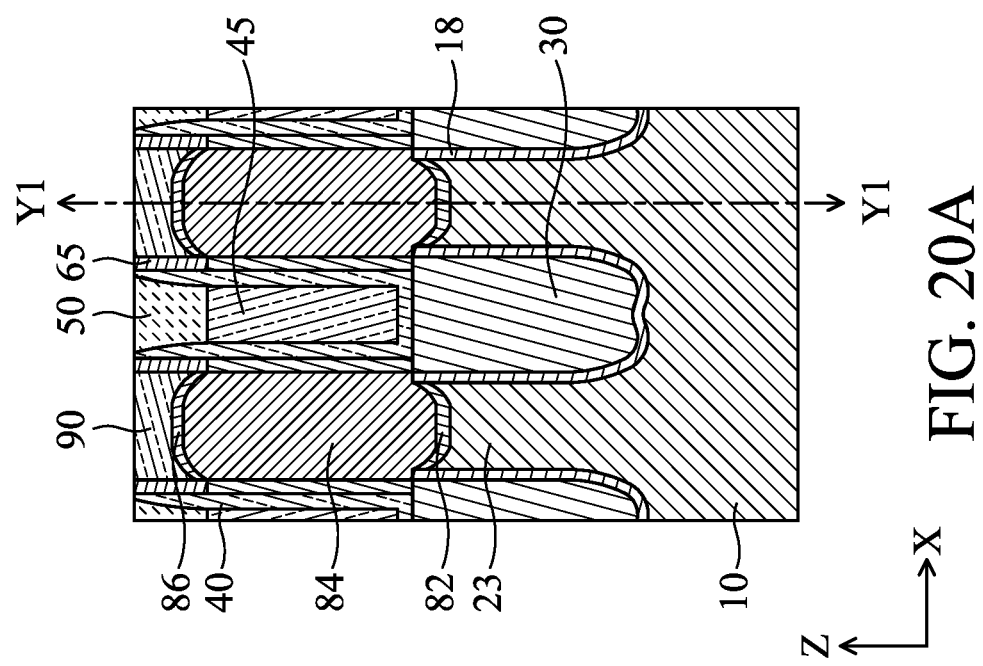

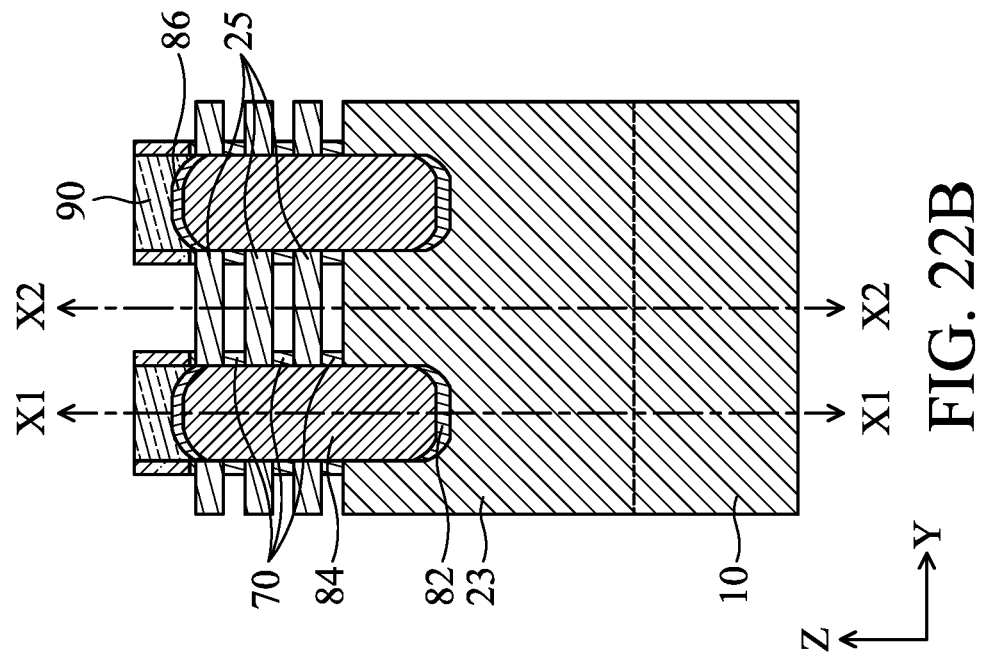
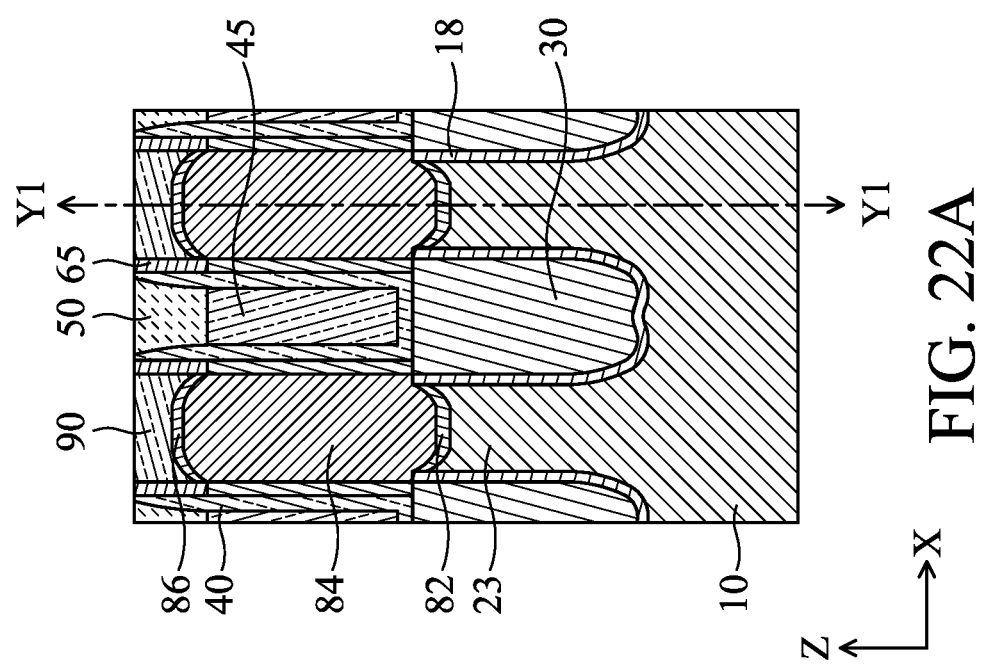

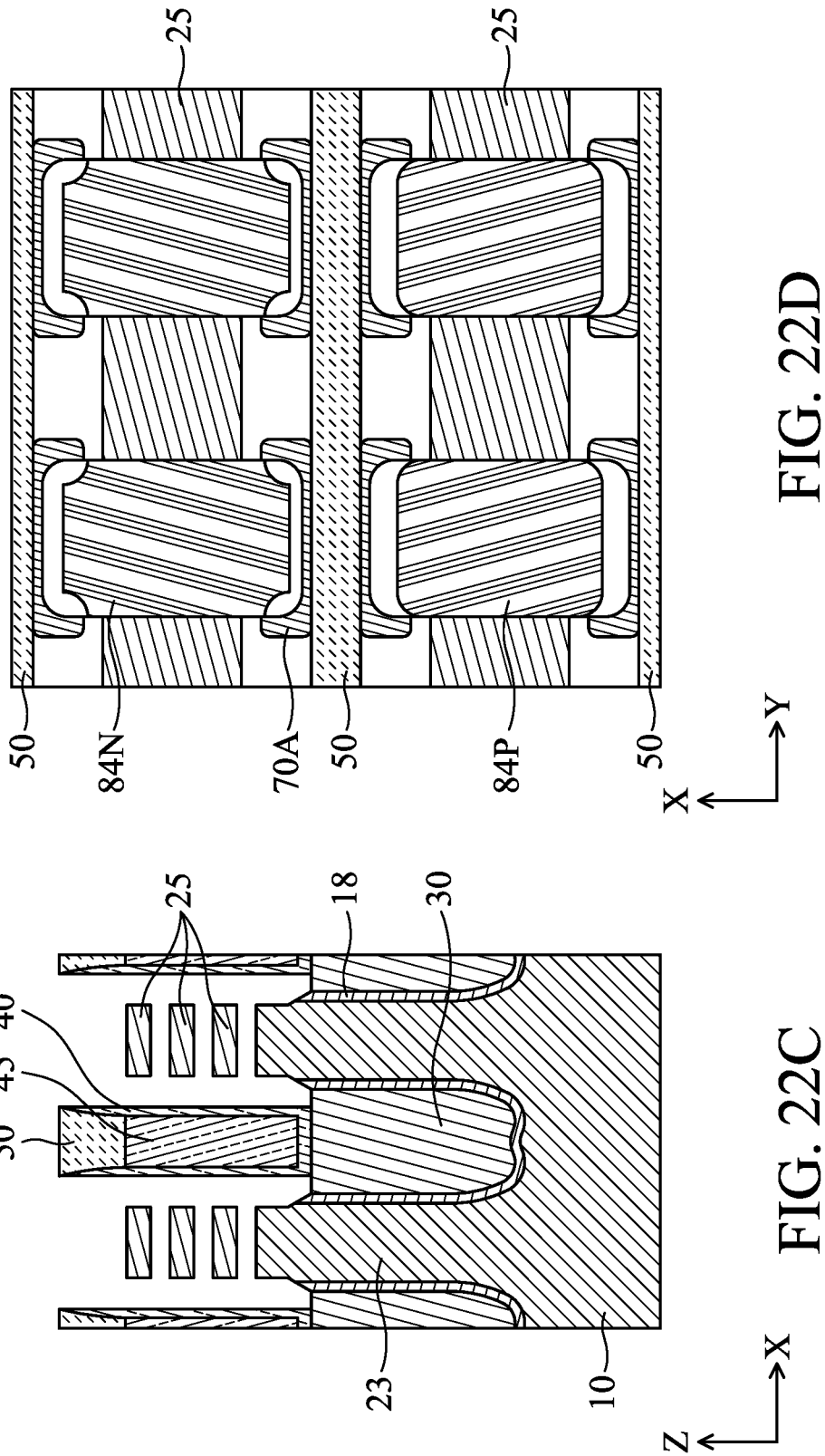

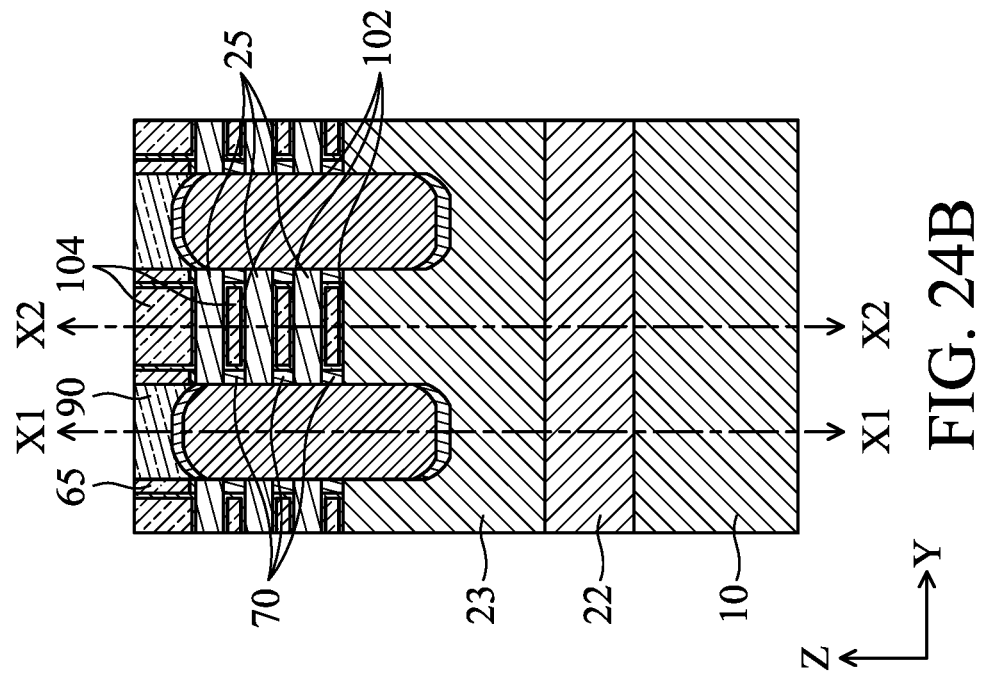
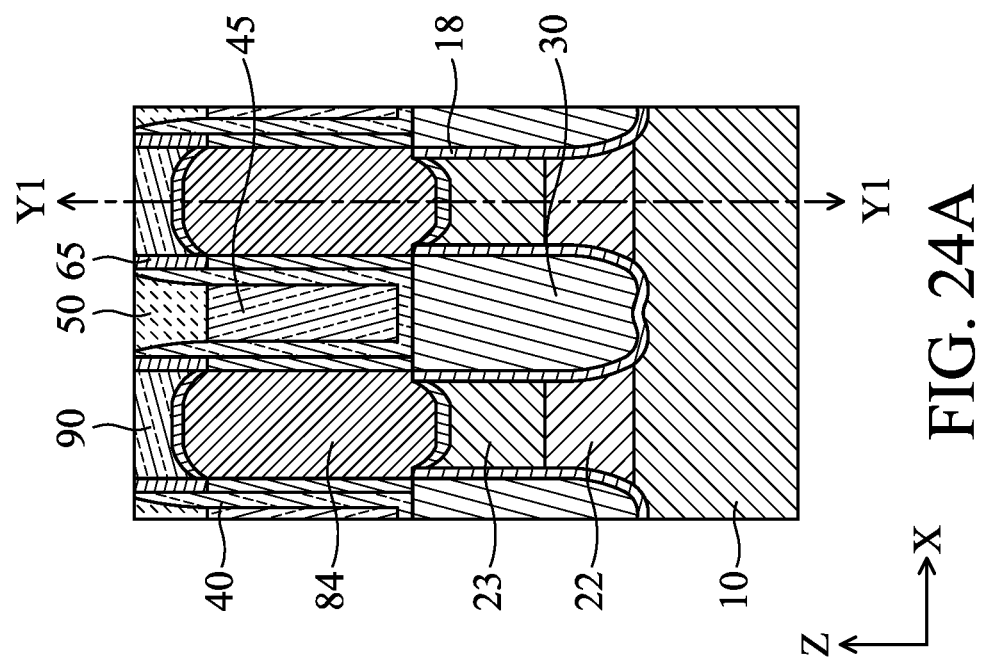
FIG. 24B
FIG. 24A

METHOD OF MANUFACTURING A SEMICONDUCTOR DEVICE AND A SEMICONDUCTOR DEVICE

RELATED APPLICATIONS

This application is a continuation of U.S. patent application Ser. No. 17/368,496 filed on Jul. 6, 2021, now U.S. Pat. No. 11,605,727, which claims priority to U.S. Provisional Patent Application No. 63/168,795 filed on Mar. 31, 2021, the entire contents of each of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down to sub 10-15 nm technology nodes, further improvements of the GAA FET are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A, 1B, 2A, 2B, 3, 4, 5, 6, 7A, 7B, 7C, 7D, 7E, 8 and 9 show cross sectional views of various stages of manufacturing a semiconductor GAA FET device according to an embodiment of the present disclosure.

FIGS. 11A, 11B, 11C and 11D show various views of one of the various stages of manufacturing a semiconductor GAA FET device according to an embodiment of the present disclosure.

FIGS. 15A, 15B, 15C and 15D show various views of one of the various stages of manufacturing a semiconductor GAA FET device according to an embodiment of the present disclosure.

FIGS. 16A, 16B, 16C and 16D show various views of one of the various stages of manufacturing a semiconductor GAA FET device according to an embodiment of the present disclosure.

FIGS. 17A, 17B, 17C and 17D show various views of one of the various stages of manufacturing a semiconductor GAA FET device according to an embodiment of the present disclosure.

FIGS. 18A, 18B, 18C and 18D show various views of one of the various stages of manufacturing a semiconductor GAA FET device according to an embodiment of the present disclosure.

FIGS. 20A, 20B and 20C show various views of one of the various stages of manufacturing a semiconductor GAA FET device according to an embodiment of the present disclosure.

FIGS. 22A, 22B, 22C and 22D show various views of one of the various stages of manufacturing a semiconductor GAA FET device according to an embodiment of the present disclosure.

FIGS. 24A, 24B, 24C and 24D show various views of one of the various stages of manufacturing a semiconductor GAA FET device according to an embodiment of the present disclosure.

DETAILED DESCRIPTION

Figure 1A:
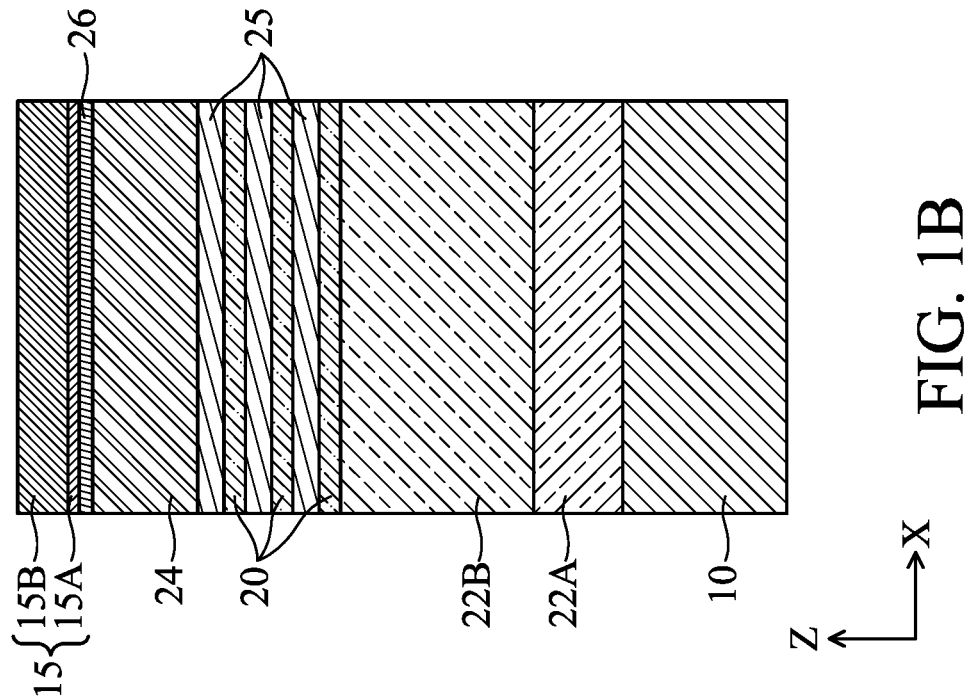

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

One of the factors to determine device performance of a field effect transistor (FET), such as a fin FET (FinFET) and a gate-all-around (GAA) FET, is a shape of an epitaxial source/drain structure. In particular, when a source/drain region of a FinFET or a GAA FET is recessed and then an epitaxial source/drain layer is formed therein, the etching substantially defines the shape of the epitaxial source/drain structure. Further, when two adjacent fin structures are closer to each other, the epitaxial layers undesirably merge with each other. In the present disclosure, a wall fin structure (a dielectric dummy fin structure) is employed to physically and electrically separate adjacent source/drain epitaxial layers and to define the shape of the source/drain epitaxial layer. An optimal source/drain shape can improve a FinFET's and GAA FET's Ion/Ioff current ratio, and can improve device performance.

In this disclosure, a source/drain refers to a source and/or a drain. It is noted that in the present disclosure, a source and a drain are interchangeably used and the structures thereof are substantially the same.

FIG. 1-23D show various stages of manufacturing a semiconductor GAA FET device according to an embodiment of the present disclosure. It is understood that additional operations can be provided before, during, and after processes shown by FIGS. 1-23D, and some of the operations described below can be replaced or eliminated, for additional embodiments of the method. The order of the operations/processes may be interchangeable.

As shown in FIG. 1A, first semiconductor layers 20 and second semiconductor layers 25 are alternately formed over a semiconductor substrate 10. In some embodiments, the semiconductor substrate 10 is a crystalline Si substrate. In other embodiments, the substrate 10 includes another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate.

The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is equal to or more than about 0.2 and equal to or less than about 0.6, and the second semiconductor layers 25 are Si or $Si_{1-y}Ge_y$, where y is smaller than x and equal to or less than about 0.1. In this disclosure, an "M" compound" or an "M based compound" means the majority of the compound is M.

The thickness of the first semiconductor layers 20 may be equal to or smaller than that of the second semiconductor layers 25, and is in a range from about 4 nm to about 30 nm in some embodiments, and is in a range from about 5 nm to about 20 nm in other embodiments. The thickness of the second semiconductor layers 25 is in a range from about 4 nm to about 30 nm in some embodiments, and is in a range from about 5 nm to about 20 nm in other embodiments. The thicknesses of the first semiconductor layers 20 may be the same as, or different from each other and the thicknesses of the second semiconductor layers 25 may be the same as, or different from each other. Although three first semiconductor layers 20 and three second semiconductor layers 25 are shown in FIG. 1A, the numbers are not limited to three, and are 1, 2 or more than 3, and less than 10 in some embodiments.

Moreover, in some embodiments, a top semiconductor layer 24 is epitaxially formed over the stacked structure of the first semiconductor layers 20 and the second semiconductor layers 25. In some embodiments, the top semiconductor layers 24 are $Si_{1-z}Ge_z$, where z is equal to or more than about 0.2 and equal to or less than about 0.7. In some embodiments, z=x. The thickness of the top semiconductor layer 24 is greater than that of each of the first semiconductor layers 20 and the second semiconductor layers 25. In some embodiments, the thickness of the top semiconductor layer 24 is in a range from about 10 nm to about 100 nm, and is in a range from about 20 nm to about 50 nm in other embodiments. Further, in some embodiments, a cap semiconductor layer 26 made of a different material than the top semiconductor layer 24 is epitaxially formed on the top semiconductor layer 24. In some embodiments, the cap semiconductor layer is made of Si and has a thickness in a range from about 0.5 nm to about 10 nm. The cap semiconductor layer 26 is used to control Ge out-diffusion from the top semiconductor layer 24, and to maintain the quality of the surface of the top semiconductor layer 24 during a chemical mechanical polishing (CMP) process subsequently performed.

Further, a hard mask layer 15 including one or more layers of an insulating material or an amorphous semiconductor material (e.g., a-Si) is formed over the cap semiconductor layer 26. In some embodiments, the hard mask layer 15 includes a first hard mask layer 15A and a second hard mask layer 15B. In some embodiments, the first hard mask layer 15A is silicon oxide having a thickness in a range from 1 nm to about 20 nm and the second hard mask layer 15B is silicon nitride having a thickness in a range from about 10 nm to about 100 nm.

After the stacked layers as shown in FIG. 1A are formed, fin structures are formed by using one or more lithography and etching operations, as shown in FIG. 2A. The fin structures may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the hard mask layer 15. By using the patterned hard mask layer as an etching mask, the stacked semiconductor layers are patterned into fin structures 29 as shown in FIG. 2A. In some embodiments, the top semiconductor layer 24 and the cap semiconductor layer 26 are part of the hard mask layer and an etch stop layer for a CMP process subsequently performed.

In FIG. 2A, the fin structures 29 extend in the Y direction and are arranged in the X direction. The number of the fin structures is not limited to two as shown in FIG. 2A, and may be as small as one and three or more. In some embodiments, one or more dummy fin structures are formed on both sides of the fin structures 29 to improve pattern fidelity in the patterning operations. As shown in FIG. 2A, the alternate stack of the first and second semiconductor layers is disposed on a bottom fin structure 23.

The width of the upper portion of the fin structure 29 along the Y direction is in a range from about 5 nm to about 40 nm in some embodiments, and is in a range from about 10 nm to about 30 nm in other embodiments.

In some embodiments, a first bottom semiconductor layer 22A is epitaxially formed on a semiconductor substrate 10 before the alternate stack of the first and second semiconductor layers are formed. The first bottom semiconductor layer 22A is made of different material than the substrate 10. When the substrate 10 is a Si substrate, the first bottom semiconductor layer 22A includes SiGe, where a Ge content is about 10 atomic % to about 60 atomic % ($Si_{0.9}Ge_{0.1}$-$Si_{0.4}Ge_{0.6}$) in some embodiments. The thickness of the first bottom semiconductor layer 22A is in a range from about 4 nm to about 30 nm in some embodiments, and is in a range from about 5 nm to about 25 nm in other embodiments.

Further, a second bottom semiconductor layer 22B is epitaxially formed over the first bottom semiconductor layer 22A. The second bottom semiconductor layer 22B is made of different material than the first bottom semiconductor layer 22A. When the first bottom semiconductor layer 22A is made of SiGe, the second bottom semiconductor layer 22B includes Si or SiGe, where a Ge content is smaller than the first bottom semiconductor layer 22B and is more than 0 atomic % to about 10 atomic % in some embodiments. The thickness of the second bottom semiconductor layer 22B is in a range from about 40 nm to about 200 nm in some embodiments, and is in a range from about 50 nm to about 150 nm in other embodiments.

Figure 1B:
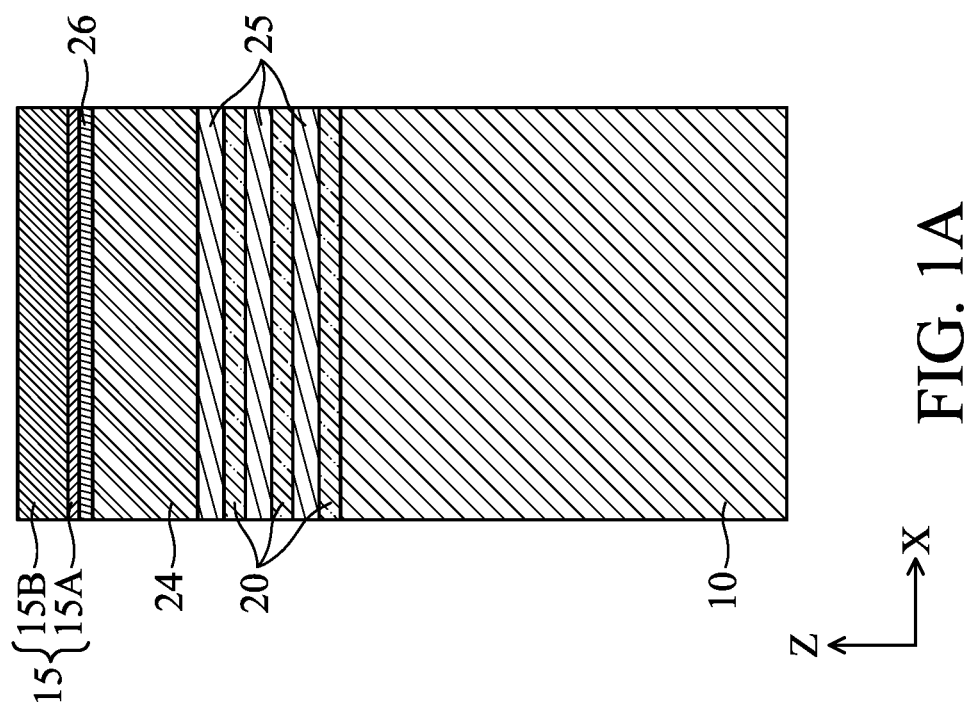

Then, as shown in FIG. 1B, the first semiconductor layers 20 and second semiconductor layers 25 are alternately formed over the second bottom semiconductor layer 22B. Further similar to FIG. 2A, the fin structures 29 are formed as shown in FIG. 2B.

After the fin structures 29 are formed as shown in FIG. 2A, one or more liner insulating layers 18 are formed over the fin structures 29, and an insulating material layer 30 including one or more layers of insulating material is formed over the substrate so that the fin structures 29 with the liner layer 18 are fully embedded in the insulating layer 30.

Figure 3:
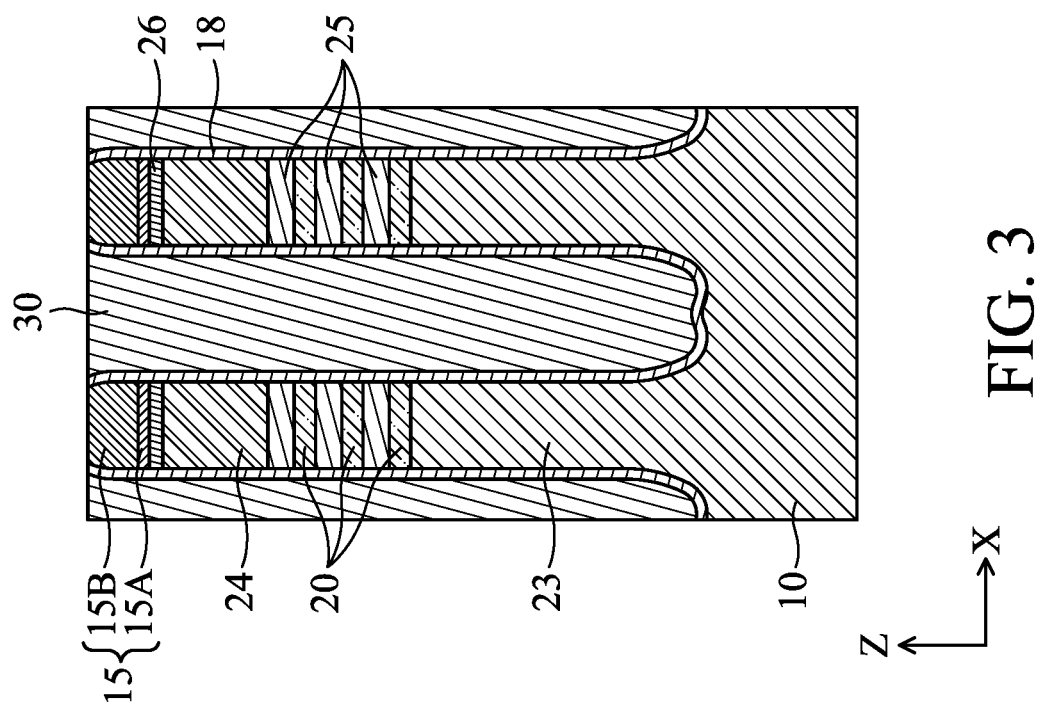

The insulating material for the liner layer 18 and the insulating layer 30 are the same or different from each other, and include one or more of silicon oxide, silicon nitride, silicon oxynitride (SiON), SiOCN, SiOC, SiCN, fluorine-doped silicate glass (FSG), or a low-k dielectric material. In some embodiments, the liner layer 18 is made of silicon oxide or silicon nitride, and the insulating layer 30 is made of silicon oxide. The insulating material is formed by LPCVD (low pressure chemical vapor deposition), plasma-enhanced CVD (PECVD), flowable CVD and/or atomic layer deposition (ALD). An anneal operation may be performed after the formation of the insulating layer 30. Then, a planarization operation, such as a chemical mechanical polishing (CMP) method and/or an etch-back method, is performed such that the upper surface of the hard mask layer 15 (the second hard mask layer 15B) is exposed from the insulating material layer 30, as shown in FIG. 3.

Figure 4:
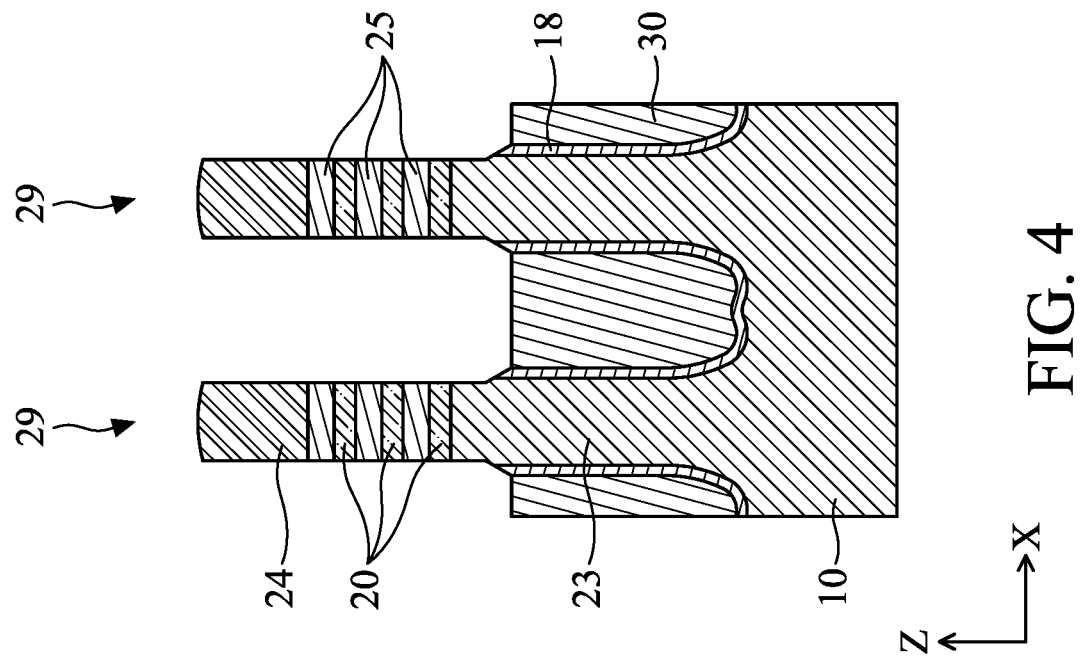

Then, as shown in FIG. 4, the insulating material layer is recessed to form an isolation insulating layer 30 so that the upper portions of the fin structures 29 are exposed. With this operation, the fin structures 29 are separated from each other by the isolation insulating layer 30, which is also called a shallow trench isolation (STI).

In some embodiments, the insulating material layer 30 is recessed until the upper portion of the bottom fin structure 23 is exposed. The first semiconductor layers 20 are sacrificial layers which are subsequently removed, and the second semiconductor layers 25 are subsequently formed into semiconductor wires or sheets (nano-bodies or nano-structures) as channel layers of a GAA FET. In some embodiments, during or after the recess etching of the insulating layer 30, the liner layer 18, the hard mask layer 15 and the cap semiconductor layer 26 are removed, thereby exposing the top semiconductor layer 24, as shown in FIG. 4. In some embodiments, after the isolation insulating layer 30 is formed by recess etching, a wet cleaning operation is performed, which forms a chemical oxide layer 32 (see, FIG. 11D) on side faces of top semiconductor layer 24 and the first and second semiconductor layers in the exposed portion of the fin structure.

Figure 5:
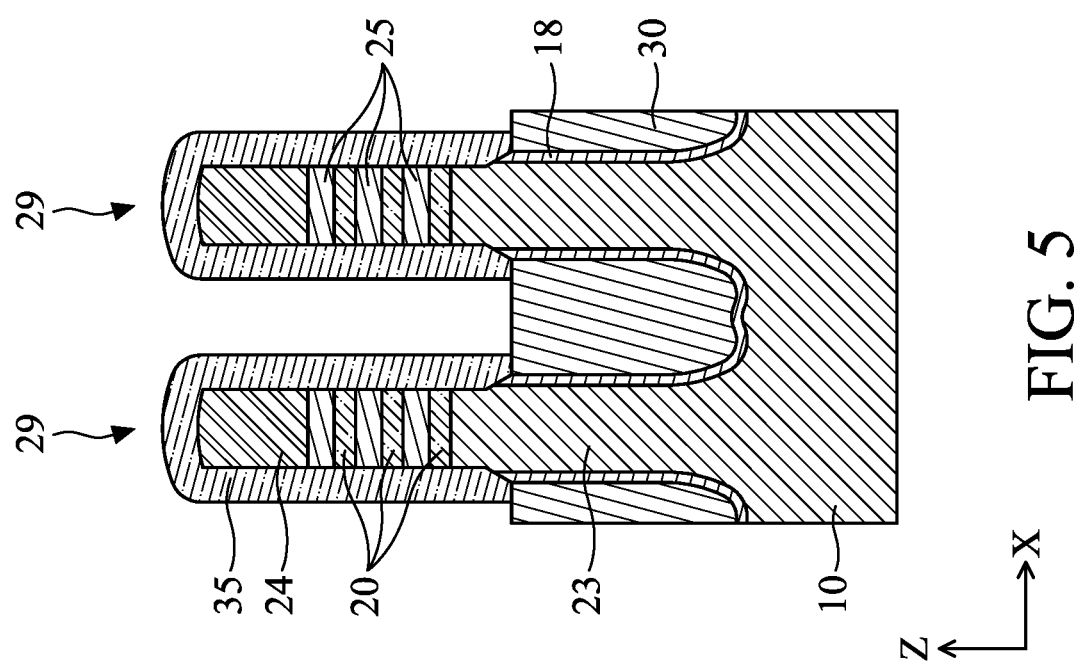

After the isolation insulating layer 30 is formed, a sacrificial cladding layer 35 is formed over the exposed portion of the fin structures 29, as shown in FIG. 5. The sacrificial cladding layer 35 includes one or more insulating materials or semiconductor materials. In some embodiments, the sacrificial cladding layer 35 includes amorphous or poly crystalline semiconductor material (e.g., Si, SiC, SiGe or Ge). In certain embodiments, the sacrificial cladding layer 35 is amorphous SiGe, having a Ge concentration in a range from about 20 atomic % to about 40 atomic %. In some embodiments, the Ge concentration of the sacrificial cladding layer 35 is the same as or similar to (difference within ±5%) the Ge concentration of the first semiconductor layer 20. In some embodiments, the thickness of the sacrificial cladding layer 35 is in a range from about 5 nm to about 50 nm. If the thickness of the sacrificial cladding layer 35 is smaller than this range, a space for a metal gate formation is too small and some of the layers of the metal gate structure would not be properly formed. If the thickness of the sacrificial cladding layer 35 is larger than this range, electrical separation between adjacent fin structures would be insufficient. In some embodiments, before forming the sacrificial cladding layer 35, a thin semiconductor layer is formed over the exposed portion of the fin structures 29. In some embodiments, the thin semiconductor layer is non-doped Si. In some embodiments, the non-doped Si is crystalline Si. In some embodiments, the thickness of the thin semiconductor layer is in a range from about 2 nm to about 3 nm. The sacrificial cladding layer 35 is conformally formed by CVD or ALD in some embodiments. The deposition temperature of the sacrificial cladding layer 35 is less than or similar to the deposition temperature of the first semiconductor layers 20, in some embodiments. In some embodiments, the deposition temperature of the sacrificial cladding layer 35 is in a range from about 500° C. to 650° C. The source gas includes a mixture of $SiH_4$, $GeH_4$, and HCl with $H_2$ or $N_2$ as a carrier gas. The sacrificial cladding layer 35 controls stress in the isolation area.

Figure 6:
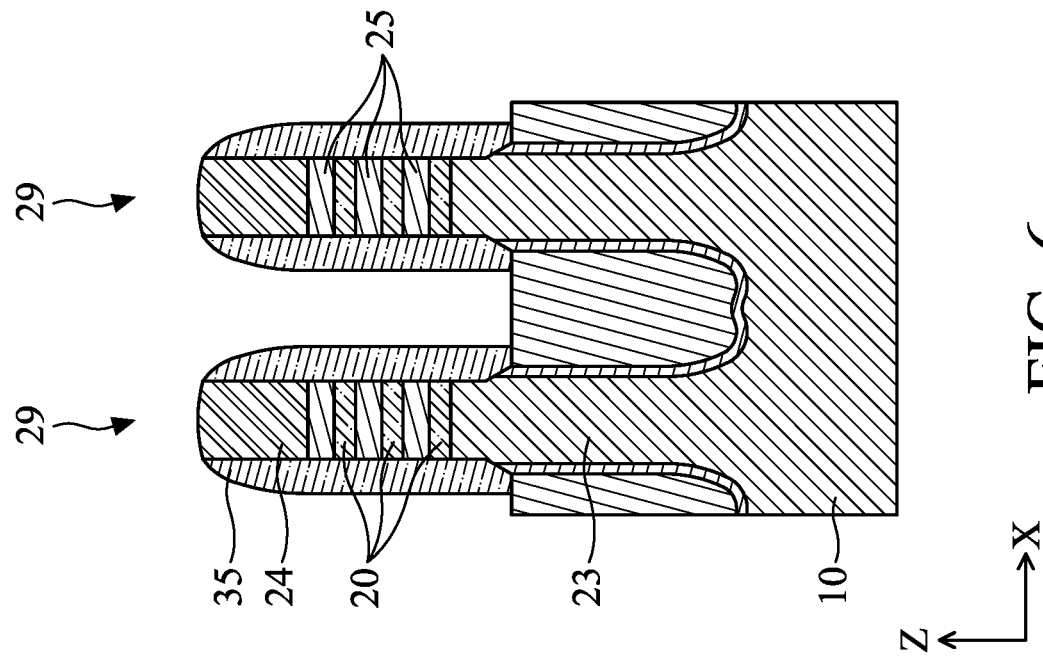

Then, as shown in FIG. 6, one or more etch-back operations are performed to remove horizontal portions of the sacrificial cladding layer 35 so as to expose the upper surface of the top semiconductor layer 24 and the upper surface of the isolation insulating layer 30. In some embodiments, after the deposition-etching operation, a wet cleaning process to remove residuals is performed.

FIGS. 7A-7D show details of the etch-back operation to remove horizontal portions of the sacrificial cladding layer 35.

Figure 7A:
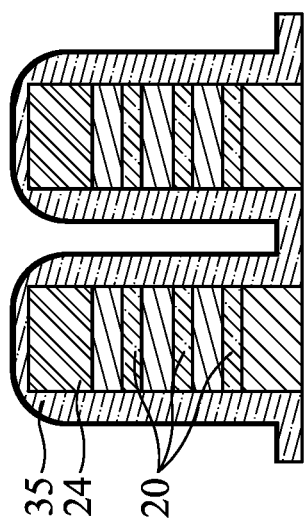
Figure 7B:
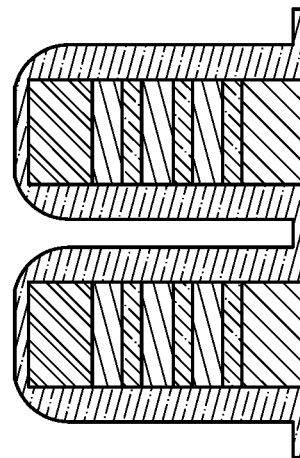

In some embodiments, as shown in FIG. 7A, a breakthrough plasma etching is performed using a mixed gas of $CF_4$ and Ar. The breakthrough etching removes the shoulder portion of the sacrificial cladding layer 35 quickly. Then, main plasma etching is performed as shown in FIG. 7B. In some embodiments, a mixed gas of $Cl_2$ and $N_2$ is used. In some embodiments, a bias voltage in the main etching is higher than the bias voltage in the breakthrough etching, by which the horizontal portion of the sacrificial cladding layer is more effectively removed. In some embodiments, the plasma is generated with RF in a range from about 0.5 MHz to 2 MHz. In some embodiments, the main etching is stopped until the remaining thickness of the horizontal portion of the sacrificial cladding layer is about 1-2 nm.

Figure 7C:
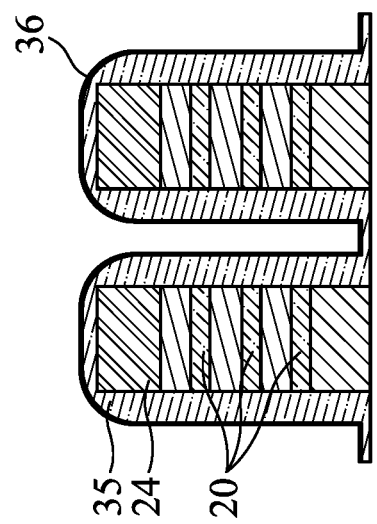

After the main etching, an atomic layer treatment process is performed to form a protection layer 36 over the sacrificial cladding layer 35 as shown in FIG. 7C. In some embodiments, the protection layer 36 includes an oxide of the sacrificial cladding layer 35 (e.g., SiGe oxide). In some embodiment, the surface of the sacrificial cladding layer 35 is directly oxidized by an oxygen containing gas by using an atomic layer treatment. In some embodiments, the oxygen containing gas is one or more of $SO_2$, $NO_2$, $N_2O$, $CO_2$, $O_2$ or ozone. In certain embodiments, $SO_2$ is used. In some embodiments, one or more carrier gases, such as $N_2$, Ar or $H_2$, are used with the oxygen containing gas. In some embodiments, the oxidation of the sacrificial cladding layer 35 is performed using plasma. In some embodiments, a substrate temperature during the plasma oxidation is in a range from about 25° C. to about 100° C., and in other embodiments, is in a range from about 40° C. to about 80° C. A thickness of the protection layer 36 is in a range from about 1 nm to about 5 nm in some embodiments. When the protection layer 36 is too thin, it does not protect the sidewalls of the sacrificial cladding layer 35 in the subsequent defooting etching operation, and when the protection layer 36 is too thick, it requires an unnecessarily long oxidation process, which may degrade the properties of the sacrificial cladding layer 35 and/or the first/second semiconductor layers. In other embodiments, the protection layer 36 includes a nitride or oxynitride of the sacrificial cladding layer 35 (e.g., SiGe nitride or SiGe oxynitride).

Figure 7D:
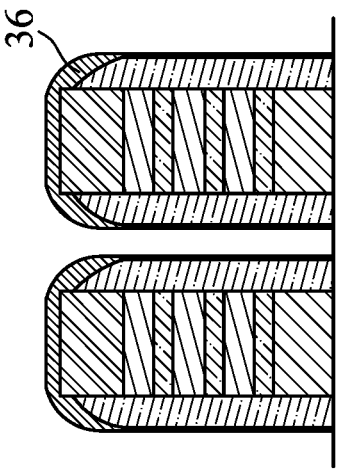
Figure 7E:
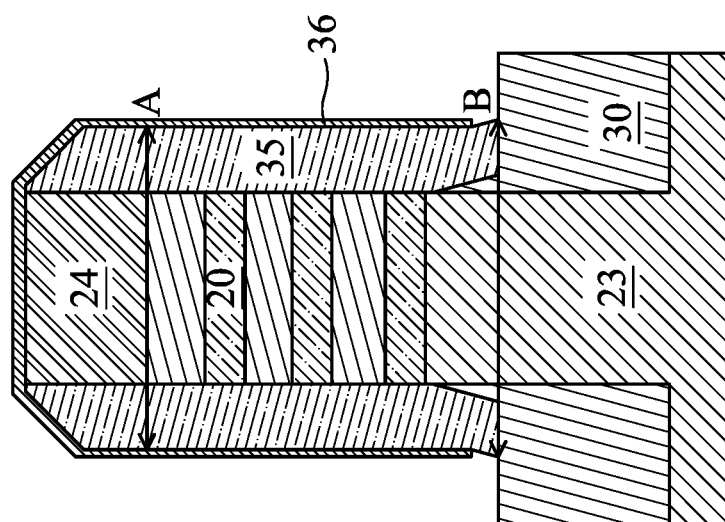

Then, as shown in FIG. 7D, a defooting etching is performed to fully remove the horizontal portion of the sacrificial cladding layer 35 formed on the isolation insulating layer 30. In some embodiments, the defooting etching uses a mixed gas of $Cl_2$ and $N_2$ or a mixed gas of $CF_4$ and Ar. In some embodiments, the defooting etching includes a high bias mode (bias voltage in a range from about 250 W to 350 W), and a low bias mode (bias voltage in a range from about 50 W to 150 W). Since the bottom part of the sidewall of the sacrificial cladding layer 35 is not covered by the protection layer 36, the bottom part is etched more compared with the middle part of the sidewall of the sacrificial cladding layer 35. Accordingly, as shown in FIG. 7E, the width A, which is a distance between the outer surfaces of the sidewalls of the sacrificial cladding layer 35 measured at the interface between the uppermost second semiconductor layer 25 and the top semiconductor layer 24 is close to the width B, which is a distance between the outer surfaces of the sidewalls of the sacrificial cladding layer 35 measured at the interface between the sidewalls of the sacrificial cladding layer 35 and the upper surface of the isolation insulating layer 30. In other words, after the etch-back operation, the sidewalls of the sacrificial cladding layer 35 do not have a tail or footing (tailed shape). In some embodiments, a value B−A is in a range from about 0 nm to about 0.1 nm in dense patterns, where the space between adjacent fin structures is about 40 nm or less. In other embodiments, the value B−A at the dense patterns is in a range from about 0.2 nm to about 0.8 nm. The value B−A is in a range from about 0.5 nm to about 1.0 nm in coarse patterns, where the space between adjacent fin structures is about 100 nm or more. When no protection layer 36 is formed, the value B−A in the coarse patterns would be 5 nm or more. In some embodiments, after the etch-back operation or during the etch-back operation, the protection layer 36 on the sidewalls of the sacrificial cladding layer 35 is fully removed by, for example, wet etching using dilute HF. In other embodiments, A>B by about 0.1 nm to about 0.5 nm at dense patterns.

Figure 8:
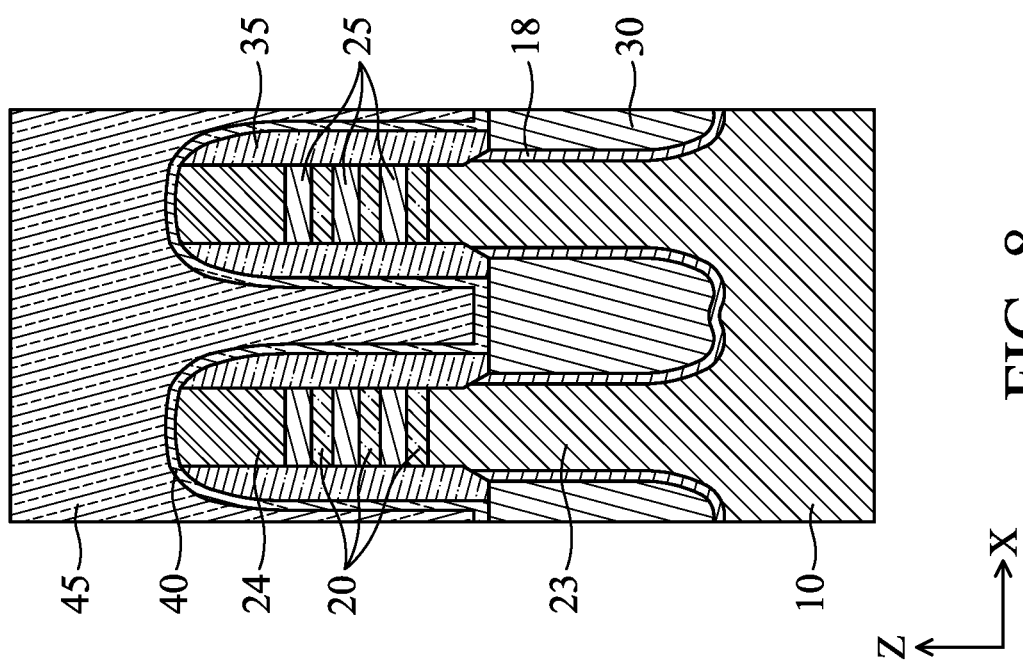

Subsequently, a first dielectric layer 40 is formed over the fin structures, and a second dielectric layer 45 is formed over the first dielectric layer 40 such that the fin structures are fully embedded in the second dielectric layer 45, as shown in FIG. 8. The first dielectric layer 40 includes one or more layers of insulating materials such as silicon oxide, silicon oxynitride, silicon nitride, SiOC, SiCN or SiOCN, formed by LPCVD (low pressure chemical vapor deposition), plasma-CVD or atomic layer deposition (ALD), or any other suitable film formation method. In certain embodiments, SiCN or SiOCN is used as the first dielectric layer 40. In some embodiments, as shown in FIG. 8, the first dielectric layer 40 is conformally formed over the fin structures such that a space is formed between adjacent fin structures. The thickness of the first dielectric layer 40 is in a range of about 2.5 nm to about 20 nm in some embodiments, and is in a range from about 5 nm to about 10 nm in other embodiments.

The material of the second dielectric layer 45 is different from the material of the first dielectric layer 40. In some embodiments, the second dielectric layer 45 includes one or more layers of insulating materials such as silicon oxide, silicon oxynitride, silicon nitride, SiOC, SiCN or SiOCN formed by LPCVD, plasma-CVD or ALD, or any other suitable film formation method. In some embodiments, the second dielectric layer 45 is made of silicon nitride or silicon oxide. In some embodiments, the second dielectric layer 45 includes a first layer and a second layer. The first layer is silicon oxide formed by, for example, a flowable CVD process followed by a thermal annealing process at 400° C. to 800° C. in an inert gas ambient. The second layer is also silicon oxide formed by a plasma CVD process. The thickness of the second dielectric layer 45 is in a range of about 60 nm to about 500 nm in some embodiments. As shown in FIG. 8, the second dielectric layer 45 fully fills the space between adjacent fin structures, in some embodiments. In other embodiments, a void is formed in the bottom part of the space. In some embodiments, one or more additional dielectric layers are formed between the first dielectric layer 40 and the second dielectric layer 45.

Figure 9:
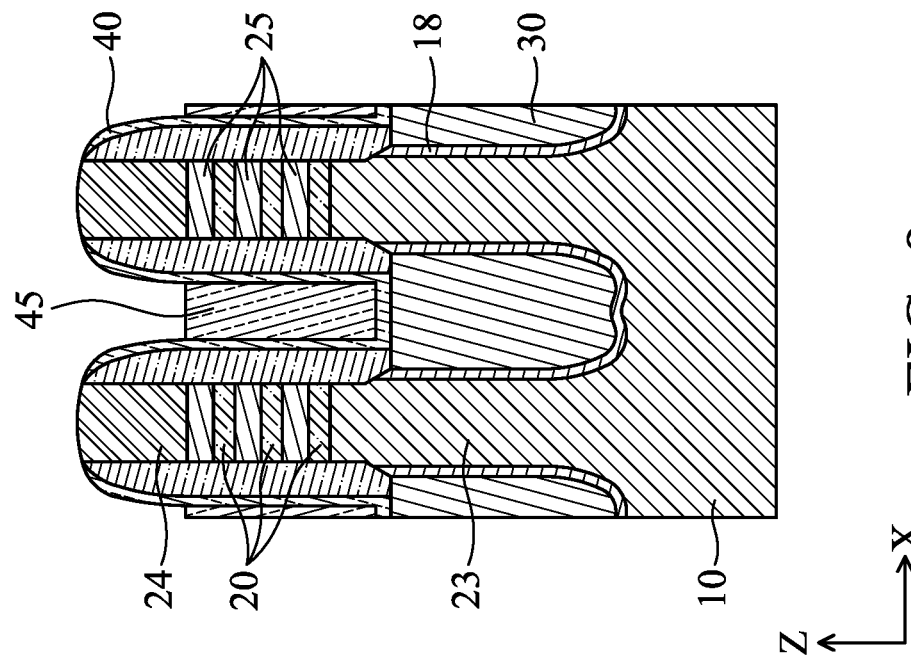

After the second dielectric layer 45 is formed, a planarization operation, such as an etch-back process or a chemical mechanical polishing (CMP) process, is performed to planarize the second dielectric layer 45 and to expose the upper surface of the top semiconductor layer 24. In some embodiments, the top semiconductor layer 24 is slightly etched by about 5 nm to about 10 nm. Further, one or more additional etch-back operations are performed to recess the second dielectric layer 45 as shown in FIG. 9. The second dielectric layer 45 is recessed to a level substantially equal (within ±5 nm) to the interface between the top semiconductor layer 24 and the uppermost one of the second semiconductor layers 25. In some embodiments, subsequently, the first dielectric layer 40 is further trimmed (etched) to expose a part of the sacrificial cladding layer 35.

Figure 10B:
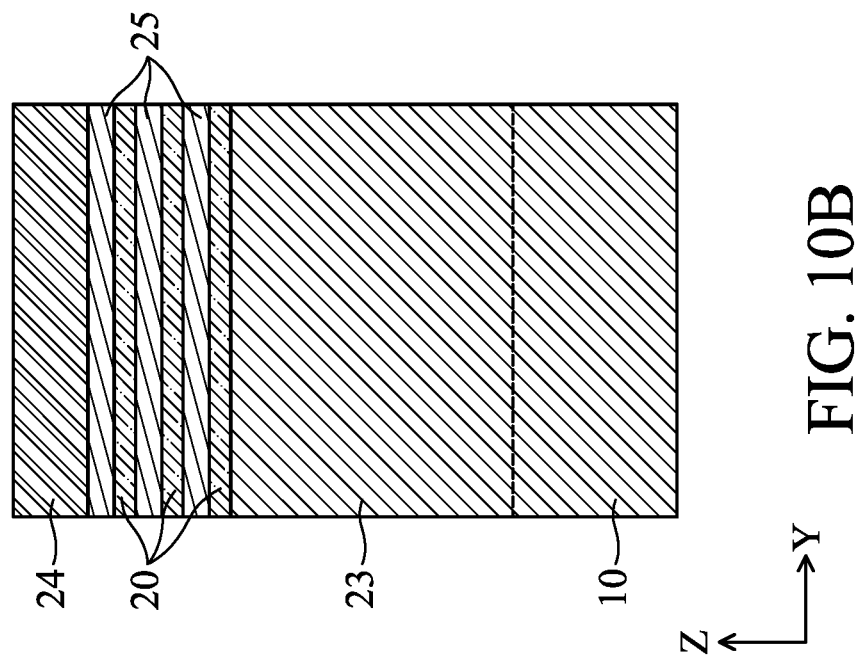
FIGS. 10A, 10B, 10C and 10D show various views of one of the various stages of manufacturing a semiconductor GAA FET device according to an embodiment of the present disclosure.
Figure 10A:
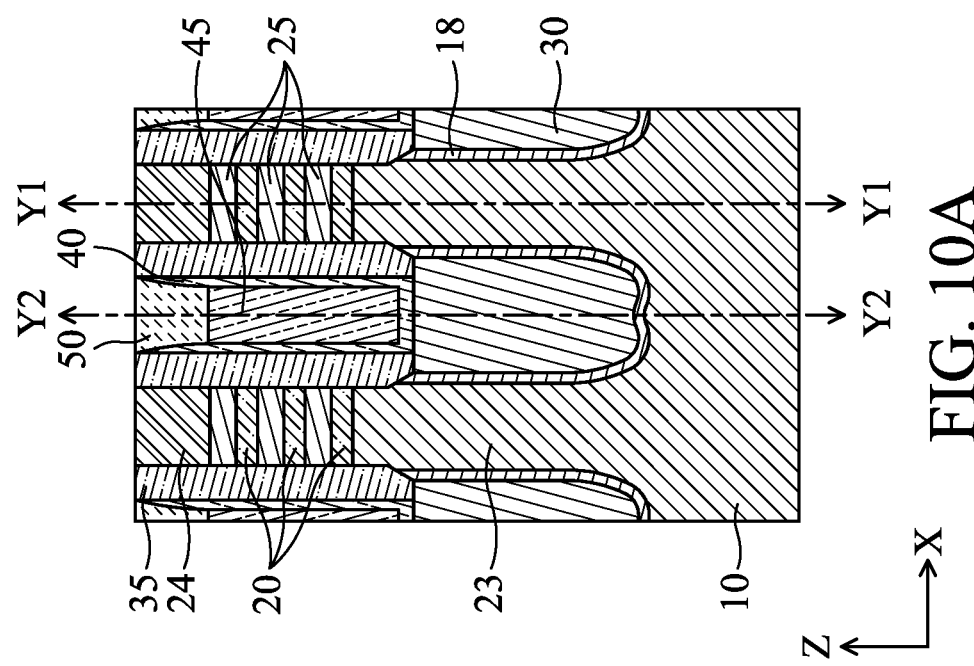
Figure 10D:
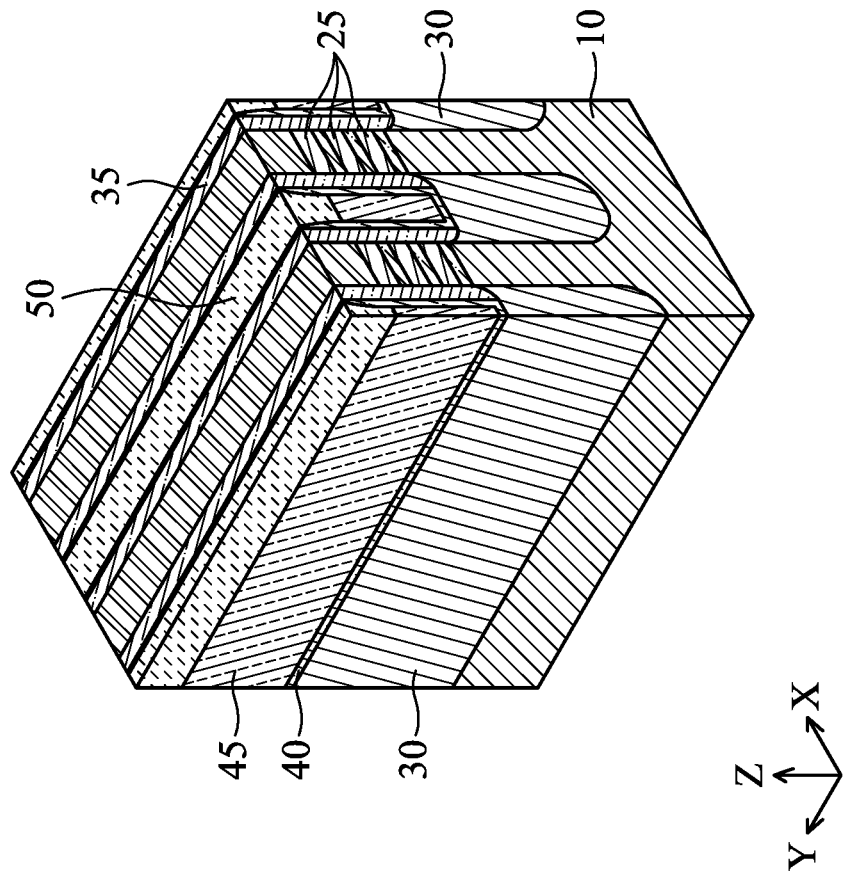
Figure 10C:
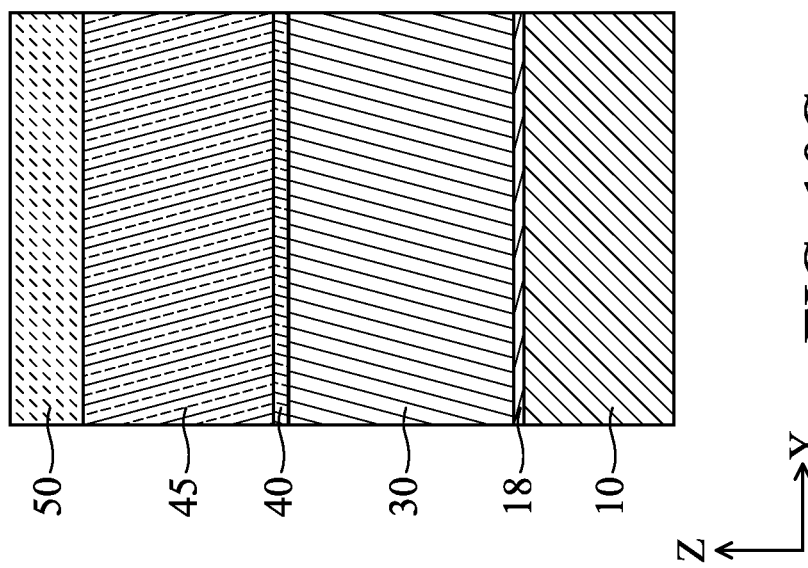

Next, as shown in FIGS. 10A-10D, a third dielectric layer 50 is formed on the recessed second dielectric layer 45. FIG. 10A is a cross sectional view along the X direction, FIG. 10B is a cross sectional view along the Y direction corresponding to line Y1-Y1 of FIG. 10A, FIG. 10C is a cross sectional view along the Y direction corresponding to line Y2-Y2 of FIG. 10A, and FIG. 10D is an isometric view.

The material of the third dielectric layer 50 is different from the materials of the first dielectric layer 40 and the second dielectric layer 45. In some embodiments, the third dielectric layer 45 includes a material having a lower etching rate than the second dielectric layer against a polysilicon or an amorphous SiGe etching. In some embodiments, the third dielectric layer 50 includes a high-k dielectric material. In some embodiments, the third dielectric layer 50 includes a dielectric material having a higher dielectric constant (k) than the second dielectric layer 45 and/or the first dielectric layer 40.

In some embodiments, the third dielectric layer 50 includes one or more of non-doped hafnium oxide (e.g., $HfO_x$, $0<x<2$), hafnium oxide doped with one or more other elements (e.g., HfSiO, HfSiON, HfTaO, HfTiO or HfZrO), zirconium oxide, aluminum oxide, titanium oxide, and a hafnium dioxide-alumina ($HfO_2$—$Al_2O_3$) alloy. In certain embodiments, hafnium oxide ($HfO_x$) is used as the third dielectric layer 50. The third dielectric layer 50 can be formed by LPCVD, plasma-CVD or ALD, or any other suitable film formation method. As shown in FIG. 10A, the third dielectric layer 50 fully fills the space between adjacent fin structures. After the third dielectric layer 50 is formed to fully cover the fin structures, a planarization operation, such as an etch-back process or a CMP process, is performed to planarize the upper surface of the third dielectric layer 50 to expose the upper surface of the top semiconductor layer 24, as shown in FIGS. 10A-10D. In some embodiments, the thickness of the third dielectric layer 50 remaining on the top semiconductor layer 24 is in a range from about 5 nm to about 100 nm, the width of the third dielectric layer 50 at the top thereof is in a range from about 10 nm to about 80 nm, depending on device and/or process requirements. Accordingly, a wall fin structure is formed by layers 40, 45 and 50 between adjacent fin structures. After the wall fin structure is formed, an annealing operation at a temperature of about 800° C. to about 1000° C. is performed for about 10 sec to about 60 sec, in some embodiments.

Figure 11D:
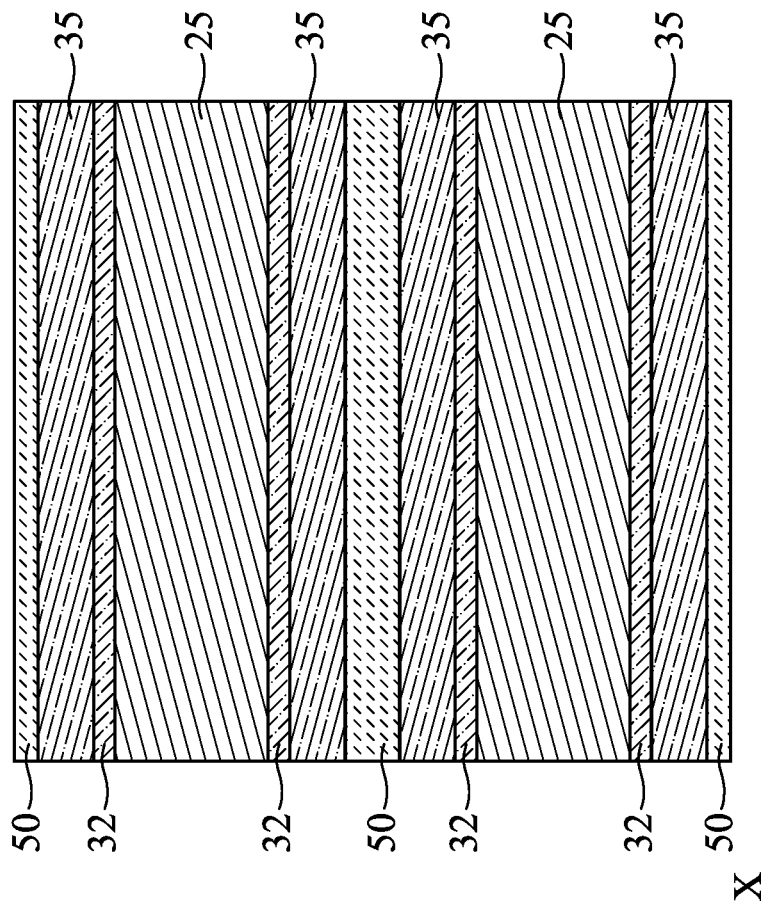
Figure 11C:
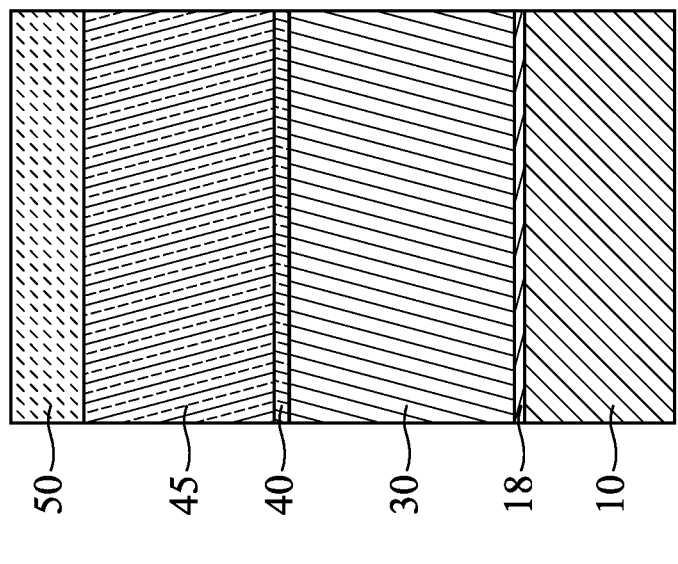

Then, as shown in FIGS. 11A-11D, the top semiconductor layer 24 is removed by one or more dry or wet etching operations. In FIGS. 11A-11C to 23A-23C, the "B" figures are cross sectional views along the Y direction corresponding to line Y1-Y1 of the "A" figures, and the "C" figures are cross sectional views along the Y direction corresponding to line Y2-Y2 of the "A" figures. FIG. 11D is a top (plan) view. As shown in FIG. 11A, a groove having sidewalls formed by the cladding layers 35 is formed. After the top semiconductor layer 24 is removed, a sacrificial gate dielectric layer 62 is formed on the uppermost one of the second semiconductor layers 25, the sidewalls of the first dielectric layer, and on the third dielectric layer 50 as shown in FIGS. 11A-11C. The sacrificial gate dielectric layer 62 includes one or more layers of insulating material, such as a silicon oxide-based material. In one embodiment, silicon oxide formed by CVD is used. The thickness of the sacrificial gate dielectric layer 62 is in a range from about 1 nm to about 5 nm in some embodiments.

Figure 12B:
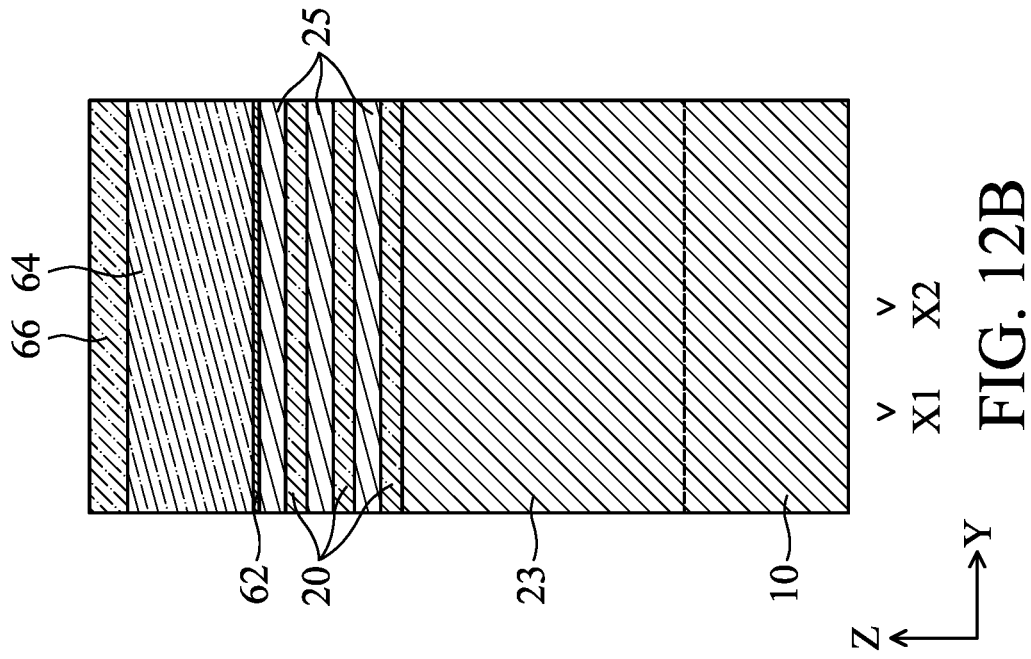
FIGS. 12A, 12B and 12C show various views of one of the various stages of manufacturing a semiconductor GAA FET device according to an embodiment of the present disclosure.
Figure 12A:
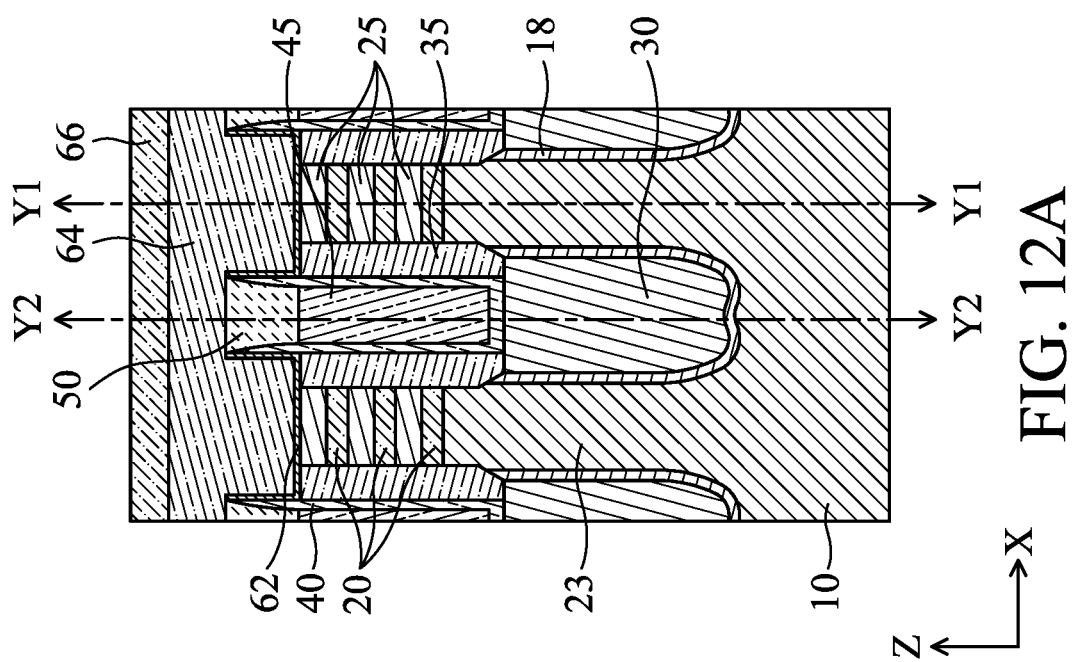
Figure 12C:
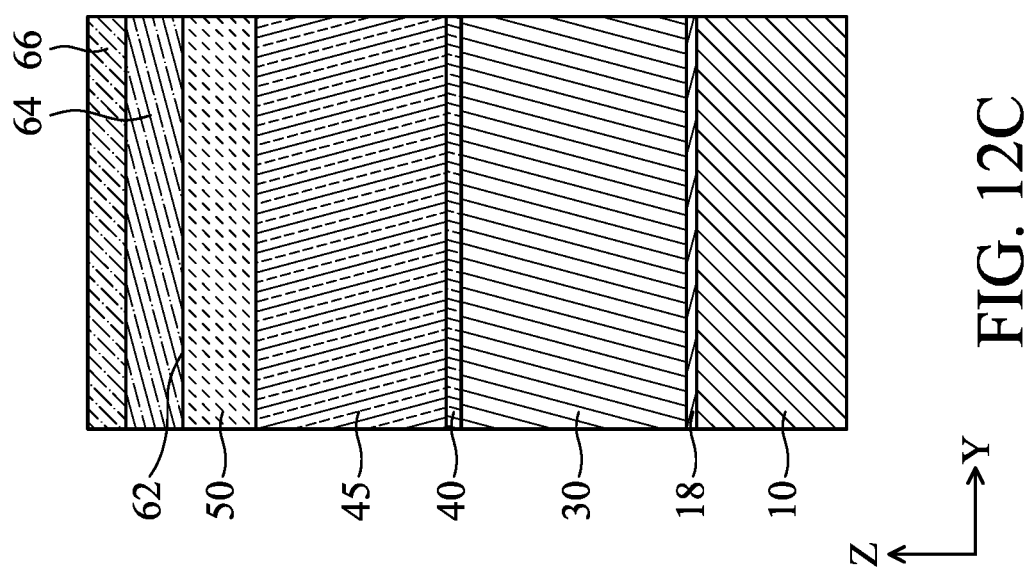

Further, as shown in FIGS. 12A-12C, a sacrificial (dummy) gate electrode layer 64 is formed, and a hard mask layer 66 is formed on the sacrificial gate electrode layer 64. The sacrificial gate electrode layer 64 is blanket deposited on the sacrificial gate dielectric layer 62 and over the third dielectric layer 50, such that the third dielectric layer 50 is fully embedded in the sacrificial gate electrode layer 64. The sacrificial gate electrode layer 64 includes silicon such as polycrystalline silicon or amorphous silicon. The thickness of the sacrificial gate electrode layer 64 is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, the hard mask layer 66 is formed over the sacrificial gate electrode layer. The hard mask layer 66 includes one or more layers of silicon nitride layer or silicon oxide.

Figure 13B:
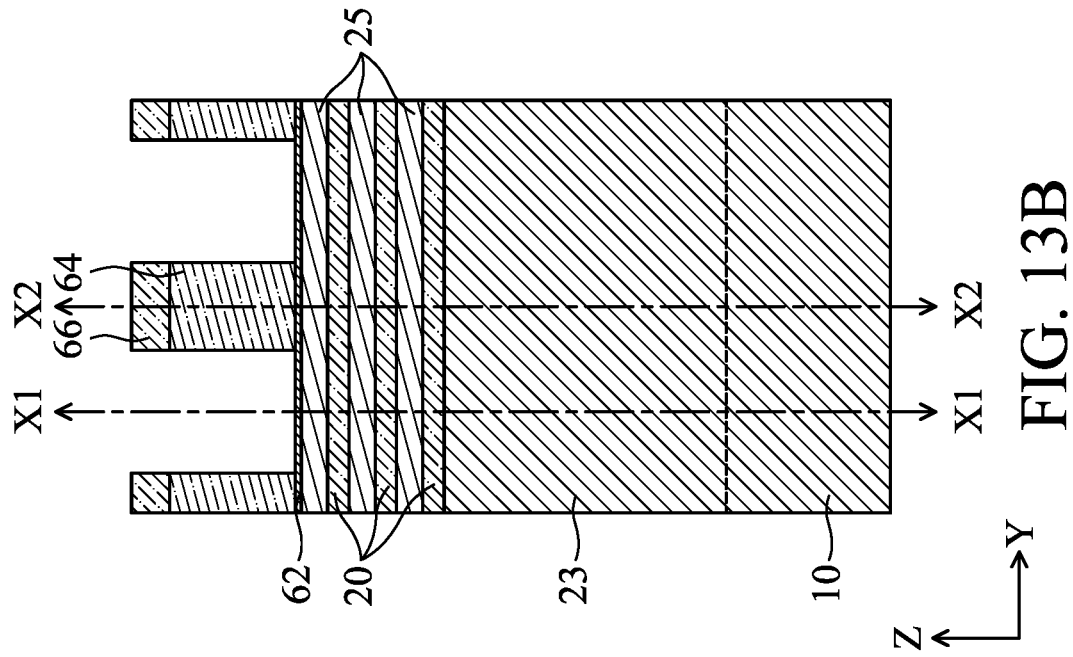
FIGS. 13A, 13B and 13C show various views of one of the various stages of manufacturing a semiconductor GAA FET device according to an embodiment of the present disclosure.
Figure 13A:
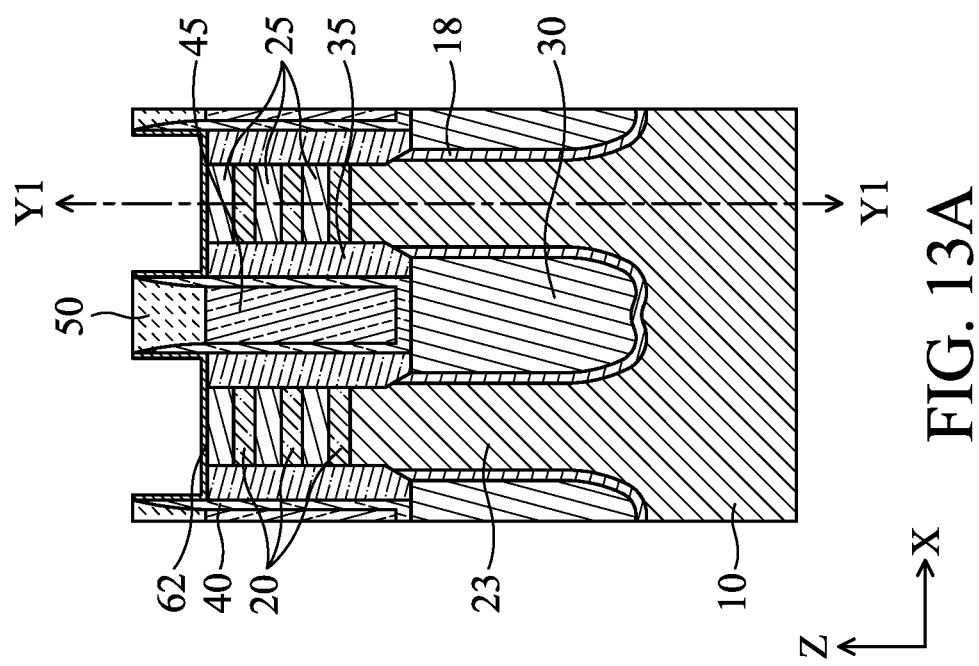
Figure 13C:
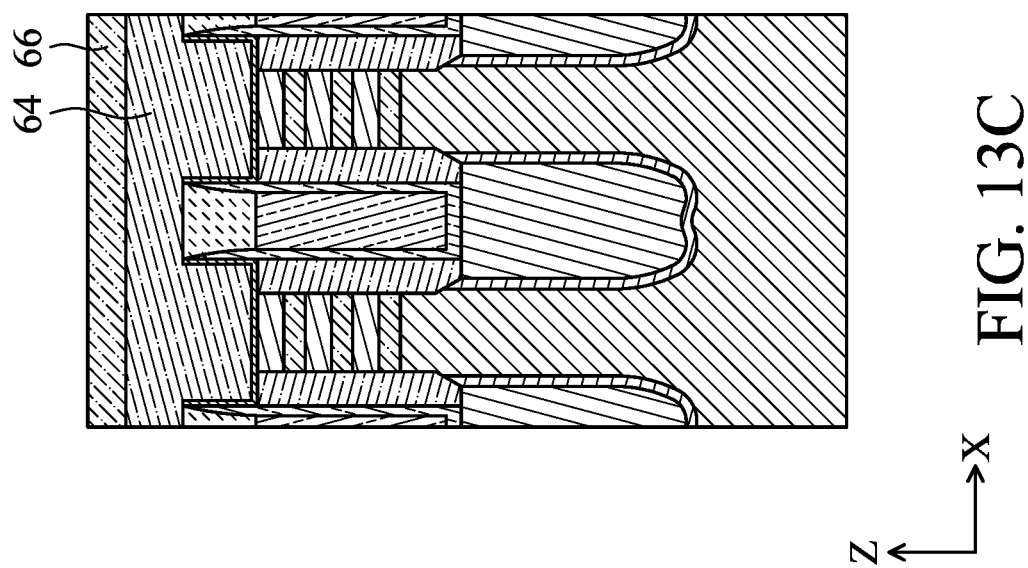

Next, a patterning operation is performed on the hard mask layer 66 and the sacrificial gate electrode layer 64 is patterned into sacrificial gate electrodes, as shown in FIGS. 13A-13C. In some embodiments, the width of the sacrificial gate electrode 64 is in a range from about 5 nm to about 30 nm and is in a range from about 10 nm to about 20 nm. Two or more sacrificial gate electrodes are arranged in the Y direction in some embodiments. In certain embodiments, one or more dummy sacrificial gate electrodes are formed on both sides of the sacrificial gate electrodes to improve pattern fidelity.

Figure 14B:
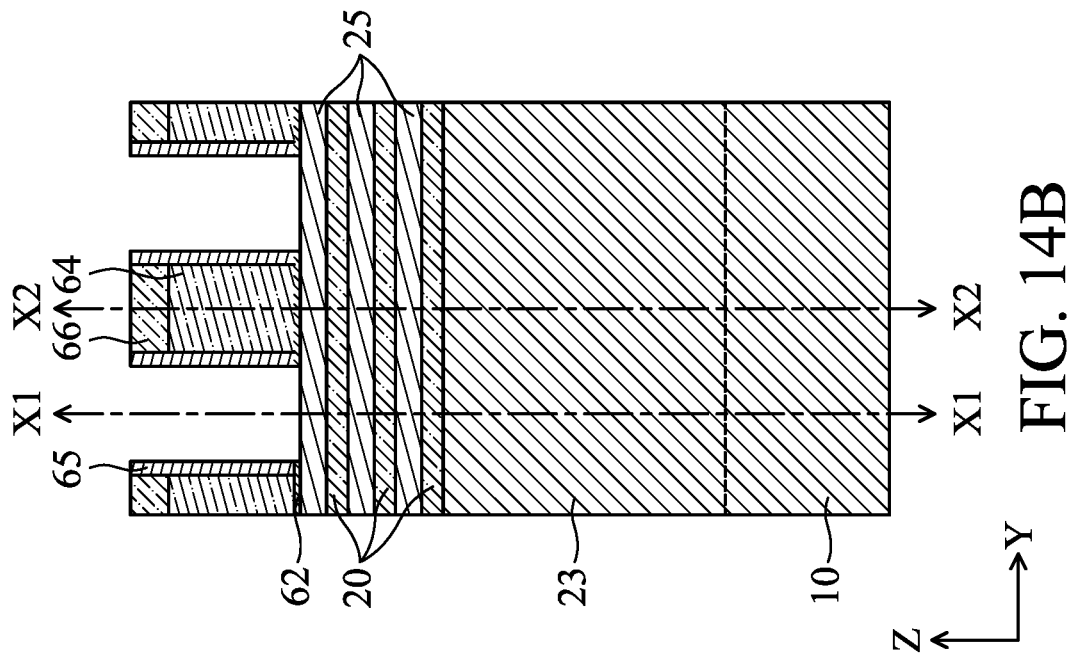
FIGS. 14A, 14B, 14C and 14D show various views of one of the various stages of manufacturing a semiconductor GAA FET device according to an embodiment of the present disclosure.
Figure 14A:
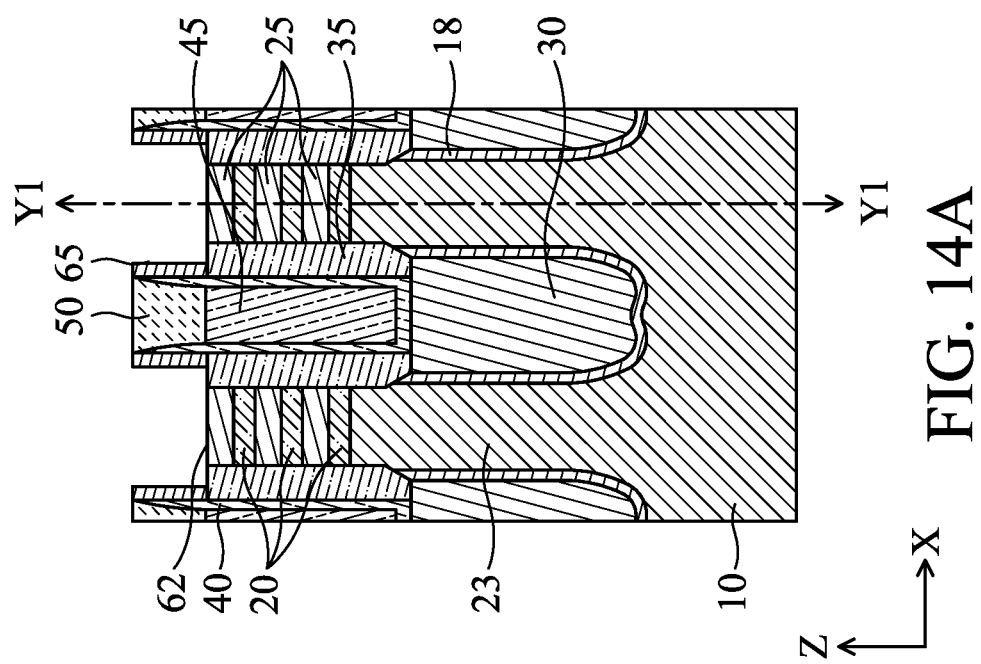
Figure 14D:
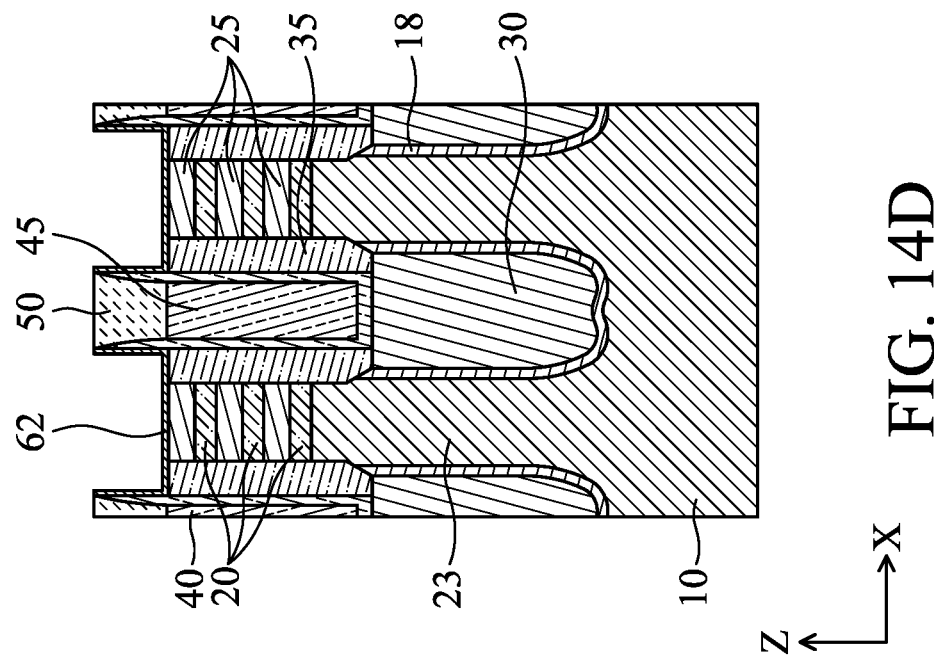
Figure 14C:
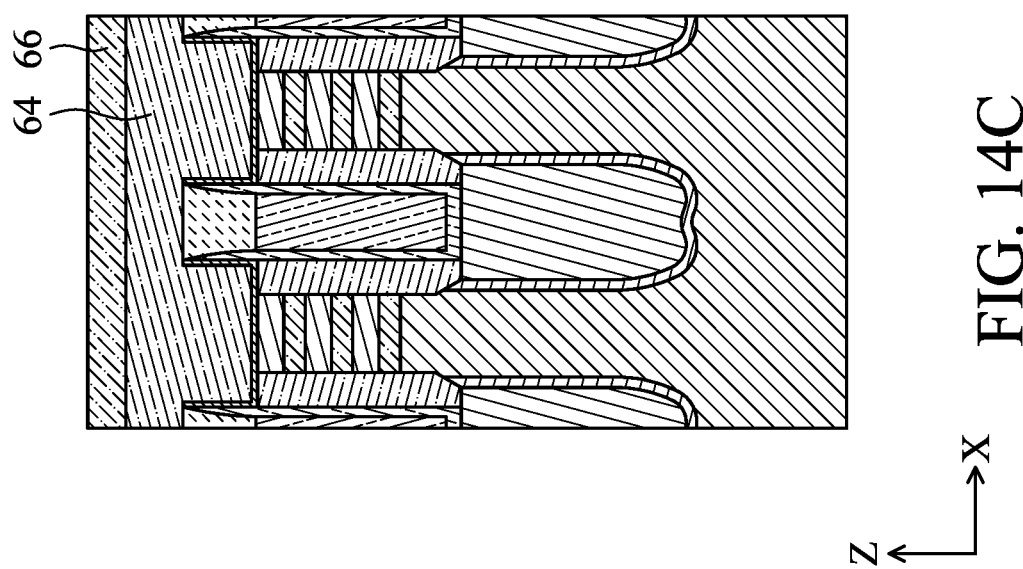

Further, sidewall spacers 65 are formed over the sacrificial gate electrodes 64, as shown in FIGS. 14A-14C. One or more insulating layers are deposited in a conformal manner to have substantially equal thicknesses on vertical surfaces, such as the sidewalls, horizontal surfaces, and the top of the sacrificial gate electrode and the sidewalls by the first dielectric layer 40, respectively. Then, by using anisotropic etching, the sidewall spacers 65 are formed. In some embodiments, the sidewall spacer has a thickness in a range from about 3 nm to about 20 nm. The sidewall spacers 65 include one or more of silicon nitride, SiON, SiCN, SiCO, SiOCN or any other suitable dielectric material. In some embodiments, since the height of the third dielectric layer 50 is much smaller than the height of the sacrificial gate electrode layer 64 with the hard mask layer, the thickness of the sidewall spacers on sidewalls of the first dielectric layer which is on the third dielectric layer 50 is smaller than the thickness of the sidewall spacers on the sacrificial gate electrode 64, or no sidewall spacer is formed on sidewalls of the first dielectric layer which is on the third dielectric layer 50 as shown in FIG. 14D.

Figure 15B:
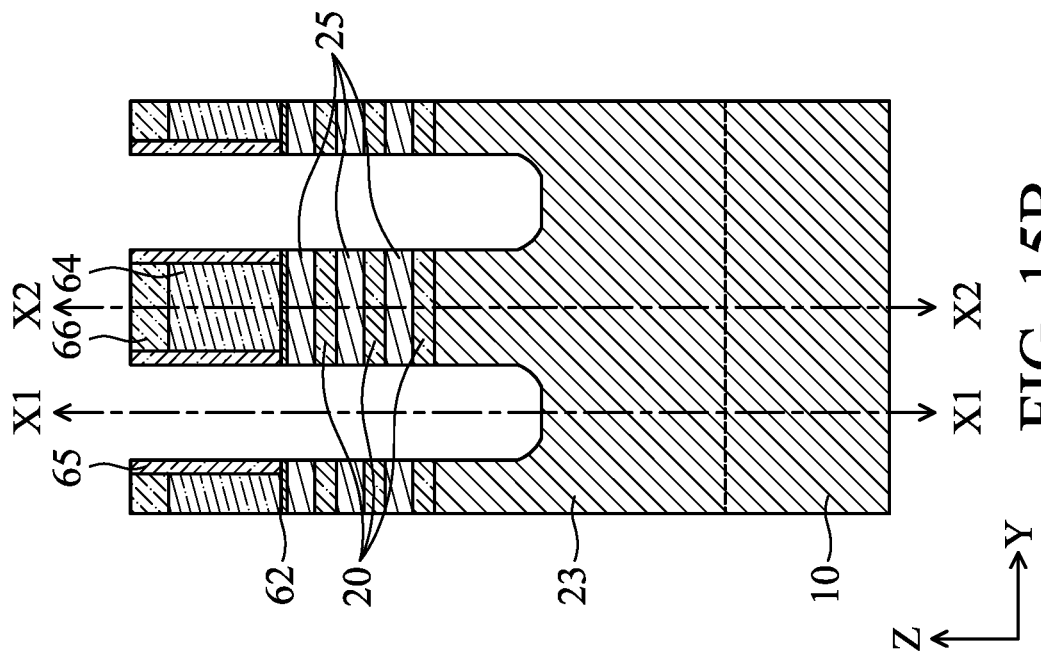
Figure 15A:
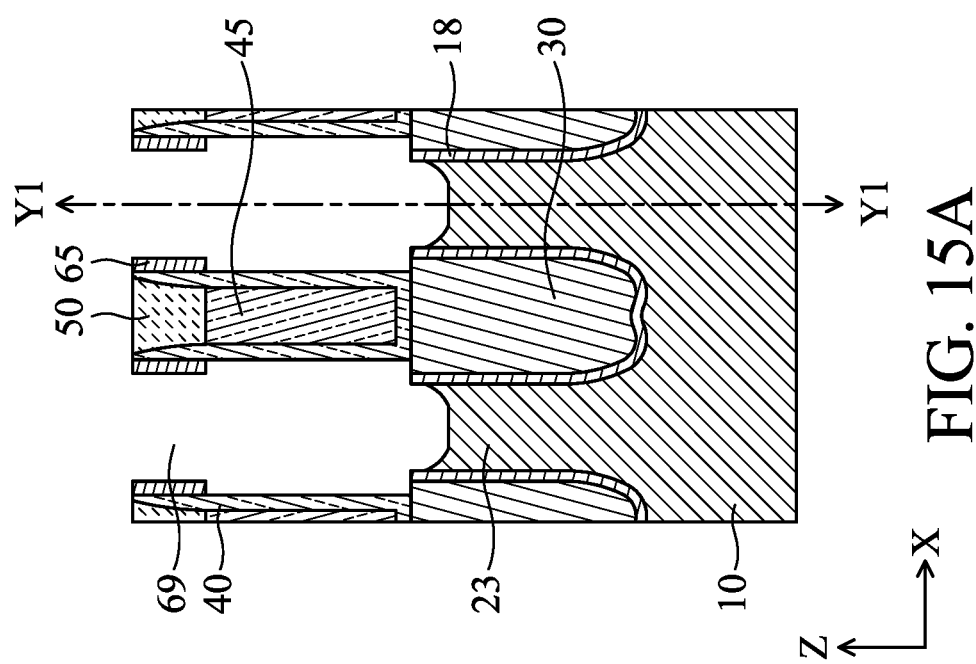

Then, the stacked structure of the first semiconductor layers 20 and the second semiconductor layer 25 is etched down at the source/drain regions, by using one or more etching operations, thereby forming a source/drain space 69, as shown in FIGS. 15A-15D. FIG. 15D is a top (plan) view in which some layers/elements are omitted for simplicity. In some embodiments, the bottom fin structure 23 is also partially etched. In some embodiments, during the etching, the sacrificial cladding layer 35 is partially or fully removed. In some embodiments, when no or thin sidewall spacer is formed on sidewalls of the first dielectric layer which is on the third dielectric layer 50, the sacrificial cladding layer 35 is also removed during the etching to form the source/drain space 69.

Figure 16D:
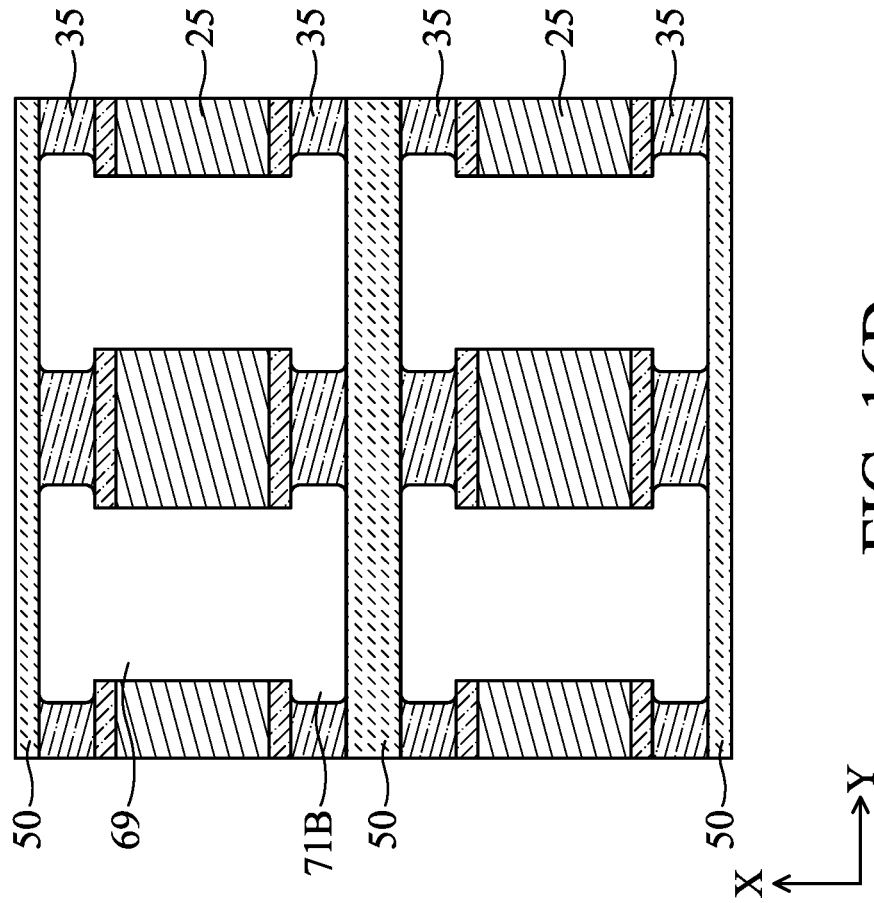
Figure 16C:
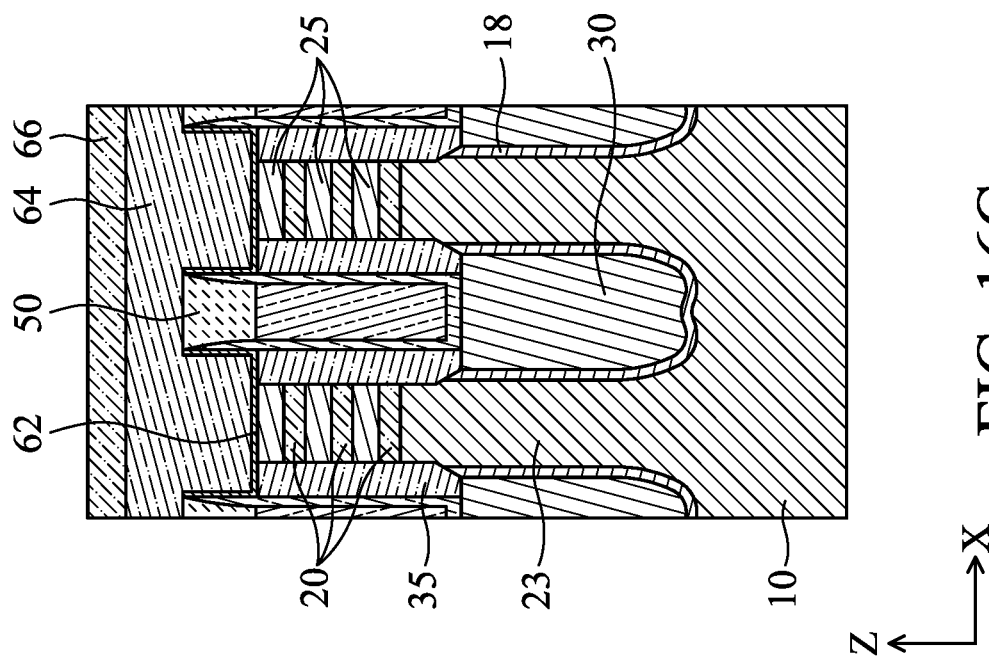

Further, inner spacers are formed a shown in FIGS. 16A-16D and 17A-17C. The first semiconductor layers 20 are laterally etched in the Y direction within the source/drain space 69, thereby forming cavities 71A as shown in FIG. 16B. The lateral amount of etching of the first semiconductor layer 20 is in a range from about 0.5 nm to about 10 nm in some embodiments, and is in a range from about 1 nm to about 5 nm in other embodiments.

When the first semiconductor layers 20 are SiGe and the second semiconductor layers 25 are Si, the first semiconductor layers 20 can be selectively etched by isotropic etching, such as wet etching. A wet etchant includes a mixed solution of $H_2O_2$, $CH_3COOH$ and HF, followed by $H_2O$ cleaning in some embodiments. In some embodiments, the etching by the mixed solution and cleaning by water is repeated 10 to 20 times. The etching time using the mixed solution is in a range from about 1 min to about 2 min in some embodiments. The mixed solution is used at a temperature in a range from about 60° C. to about 90° C. in some embodiments. As shown in FIG. 16D, the source/drain space 69 is expanded to have a cavity 71B along the Y direction.

Then, a fourth dielectric layer is conformally formed on the etched lateral ends of the first semiconductor layers 20 and on end faces of the second semiconductor layers 25 in the source/drain space 69. The fourth dielectric layer includes one of silicon nitride and silicon oxide, SiON, SiOC, SiCN and SiOCN, or any other suitable dielectric material. The fourth dielectric layer is made of a different material than the sidewall spacers 65 in some embodiments. The fourth dielectric layer can be formed by ALD or any other suitable methods.

After the fourth dielectric layer is formed, an etching operation is performed to partially remove the fourth dielectric layer, thereby forming inner spacers 70, as shown in FIG. 17B. In some embodiments, the end face of the inner spacers 70 is recessed more than the end face of the second semiconductor layers 25. The recessed amount is in a range from about 0.2 nm to about 3 nm and in in a range from about 0.5 nm to about 2 nm in other embodiments. In other embodiments, the recessed amount is less than 0.5 nm and may be equal to zero (the end face of the inner spacer 70 and the end face of the second semiconductor layers 25 are flush with each other). In some embodiments, before forming the fourth dielectric layer, an additional dielectric layer having a smaller thickness than the fourth dielectric layer is formed, and thus the inner spacers 70 have a two-layer structure.

Figure 17D:
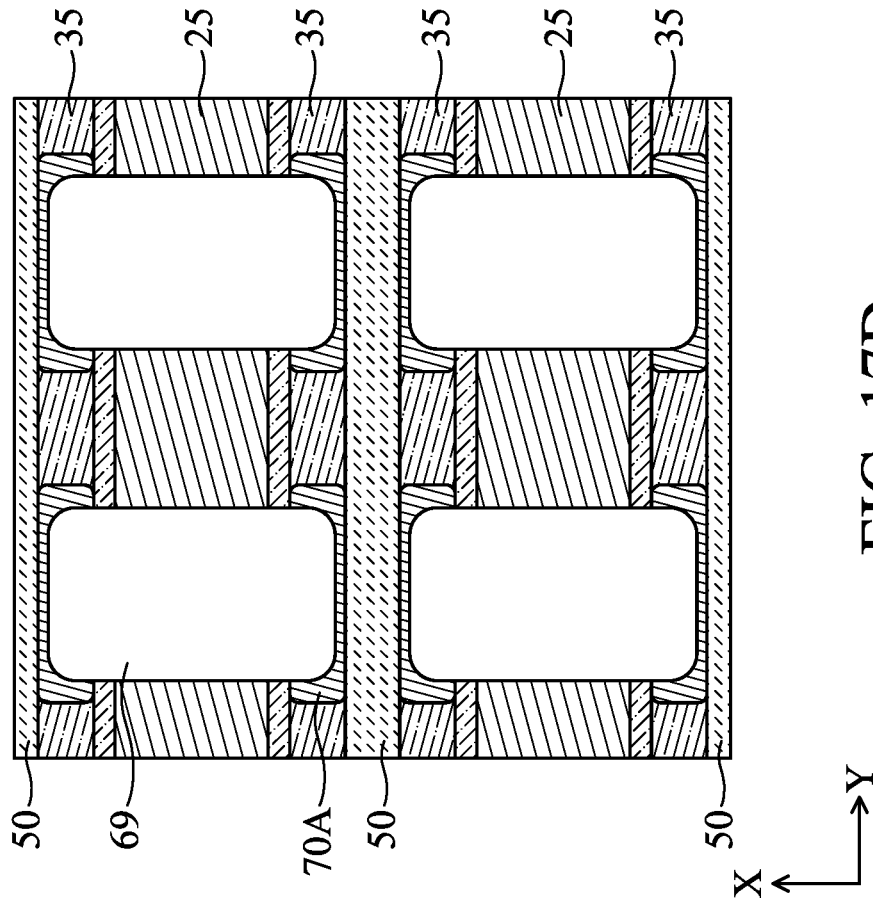
Figure 17C:
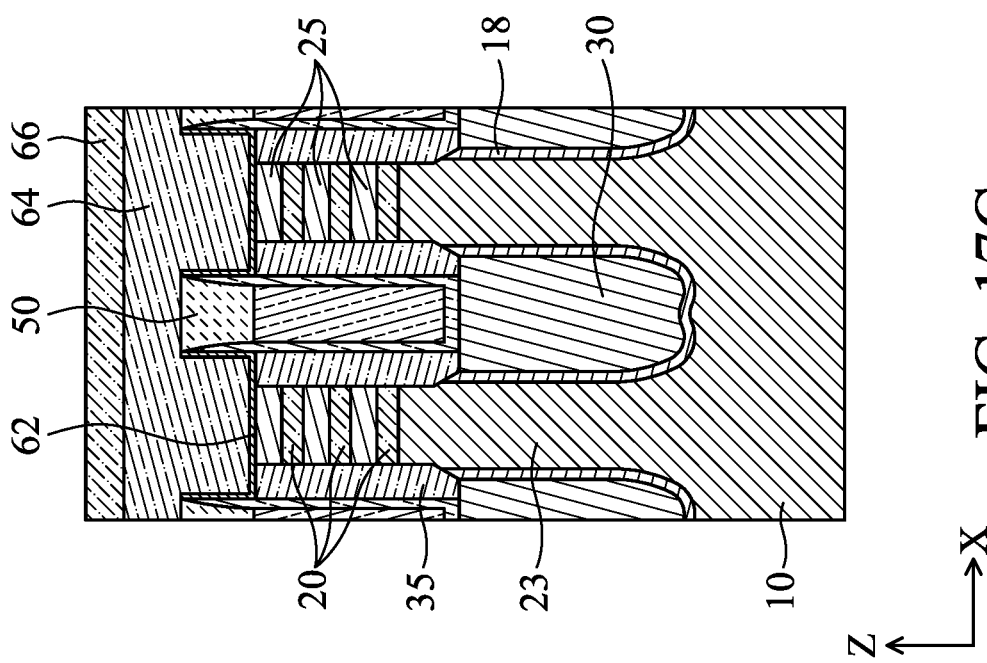

As shown in FIG. 17D, the dielectric layer 70A made of the same material as the inner spacers 70 is also formed on the remaining sacrificial cladding layer 35. The dielectric layer 70A is in contact with the third dielectric layer 50 and separates adjacent sacrificial cladding layer, in some embodiments. In addition, the bottom of the sacrificial cladding layer is sufficiently removed by the defooting etching as set forth above, no surface of the sacrificial cladding layer is exposed to the source/drain space 69.

Figure 18B:
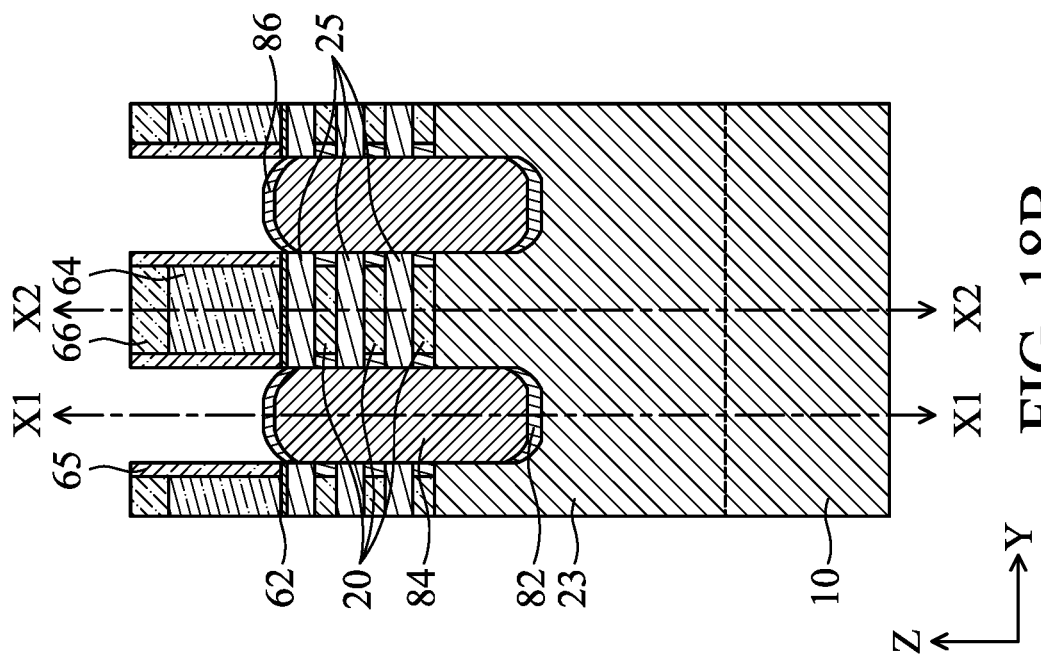

Subsequently, as shown in FIGS. 18A-18D, a source/drain epitaxial layer is formed in the source/drain space 69. FIG. 18D is a top (plan) view where some of the features/elements are omitted. The source/drain epitaxial layer includes one or more layers of SiP, SiAs, SiCP, SiPAs and/or SiC for an n-type FET, and SiGe, GeSn and/or SiGeSn for a p-type FET. In some embodiments, the semiconductor device includes a p-type FET and an n-type FET having different source/drain epitaxial layer from each other. In some embodiments, the n-type FET includes an epitaxial layer 84N including SiP, SiAs, SiCP, SiPAs and/or SiC, and the p-type FET includes an epitaxial layer 84P including SiGe, GeSn and/or SiGeSn. For the p-type FET, the source/drain epitaxial layer is doped with B (boron) in some embodiments. In some embodiments, the source/drain epitaxial layer includes multiple layers. In some embodiments, the source/drain epitaxial layer is not in contact with the dielectric layer 70A as shown in FIG. 18D leaving a void, and in other embodiments, the source/drain epitaxial layer is in contact with the dielectric layer 70A with a small void. In certain embodiments, no void is formed between the source/drain epitaxial layer and the dielectric layer 70A.

In some embodiments, the source/drain epitaxial layer of an n-type FET includes a first epitaxial layer 82, a second epitaxial layer 84 and a third epitaxial layer 86. In some embodiments, the first epitaxial layer 82 is made of SiP, SiAs or SiAs:P or combination thereof. In some embodiments, the P concentration of the first epitaxial layer 82 is in a range from about $0.5\times10^{19}$ atoms/cm$^3$ to about $5\times10^{20}$ atoms/cm$^3$, and is in a range from about $0.8\times10^{19}$ atoms/cm$^3$ to about $2\times10^{20}$ atoms/cm$^3$ in other embodiments. In some embodiments, the second epitaxial layer 84 is made of SiP. In some embodiments, the P concentration of the second epitaxial layer 84 is higher than that of the first SiP epitaxial layer 82, and is in a range from about $1\times10^{21}$ atoms/cm$^3$ to about $5\times10^{21}$ atoms/cm$^3$, and is in a range from about $2\times10^{21}$ atoms/cm$^3$ to about $4\times10^{21}$ atoms/cm$^3$ in other embodiments. In some embodiments, the third epitaxial layer 86 is made of SiGeP. In some embodiments, the P concentration of the third epitaxial layer 86 is equal to or lower than that of the second SiP epitaxial layer 84 and higher than that of the first SiP epitaxial layer 82, and is in a range from about $0.5\times10^{21}$ atoms/cm$^3$ to about $4\times10^{21}$ atoms/cm$^3$, and is in a range from about $1\times10^{21}$ atoms/cm$^3$ to about $3\times10^{21}$ atoms/cm$^3$ in other embodiments. In some embodiments, the Ge concentration of the third epitaxial layer 86 is in a range from about 0.5 atomic % to 10 atomic %, and is in a range from about 1 atomic % to about 5 atomic % in other embodiments.

In some embodiments, the source/drain epitaxial layer of a p-type FET includes a first epitaxial layer 82, a second epitaxial layer 84 and a third epitaxial layer 86. In some embodiments, the first epitaxial layer 82 is made of SiGe doped with B. In some embodiments, the Ge content is in a range from about 15 atomic % to about 30 atomic %. In some embodiments, the B concentration of the first epitaxial layer 82 is in a range from about $1\times10^{19}$ atoms/cm$^3$ to about $1\times10^{21}$ atoms/cm$^3$, and is in a range from about $5\times10^{19}$ atoms/cm$^3$ to about $5\times10^{20}$ atoms/cm$^3$ in other embodiments. In some embodiments, the second epitaxial layer 84 is made of SiGe doped with B. In some embodiments, the Ge content of the second epitaxial layer 84 is in a range from about 20 atomic % to about 35 atomic % in some embodiments. In some embodiments, the B concentration of the second epitaxial layer 84 is equal to or higher than the largest B concentration of the first epitaxial layer 82, and is in a range from about $0.5\times10^{20}$ atoms/cm$^3$ to about $1\times10^{21}$ atoms/cm$^3$, and is in a range from about $1\times10^{20}$ atoms/cm$^3$ to about $5\times10^{20}$ atoms/cm$^3$ in other embodiments. In some embodiments, the third epitaxial layer 86 is made of SiGe doped with B. In some embodiments, the Ge content is in a range from 25 atomic % to about 60 atomic %. In some embodiments, the average Ge content of the third epitaxial layer is greater than the Ge content of the second epitaxial layer. In some embodiments, the B concentration of the third epitaxial layer 86 is in a range from about $5×10^{19}$ atoms/cm$^3$ to about $5×10^{21}$ atoms/cm$^3$, and is in a range from about $1×10^{20}$ atoms/cm$^3$ to about $3×10^{21}$ atoms/cm$^3$ in other embodiments. The source/drain epitaxial layers are formed by an epitaxial growth method using CVD, ALD or molecular beam epitaxy (MBE).

Figure 18A:
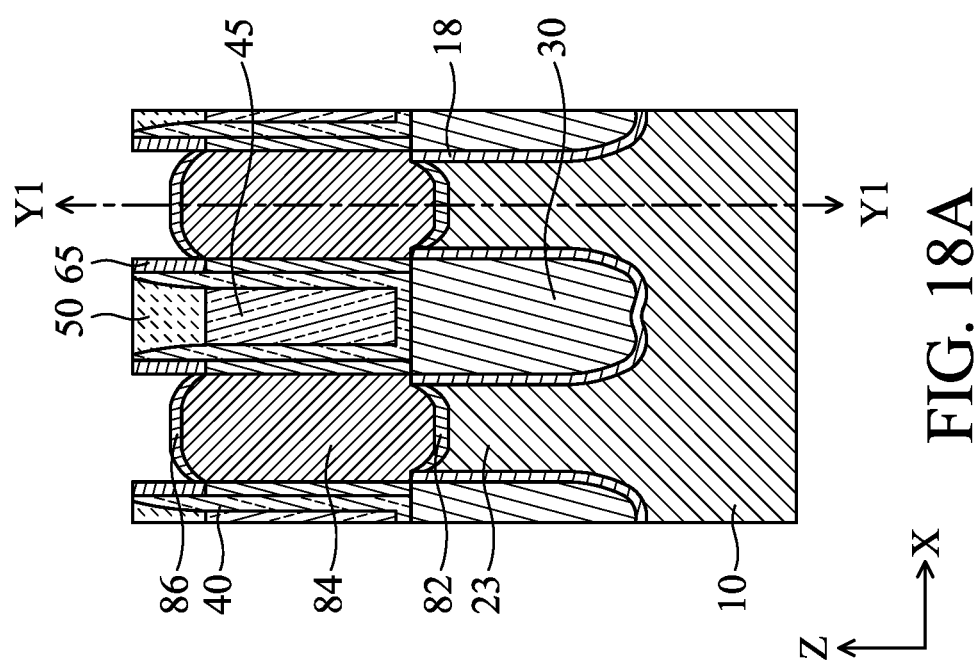

As shown in FIGS. 18A and 18D, the wall structure separating adjacent epitaxial layers along the X direction includes the second dielectric layer 45, the third dielectric layer 50, the first dielectric layer 40 as the sidewall and the fourth dielectric layer 70A (inner spacers).

Figure 19B:
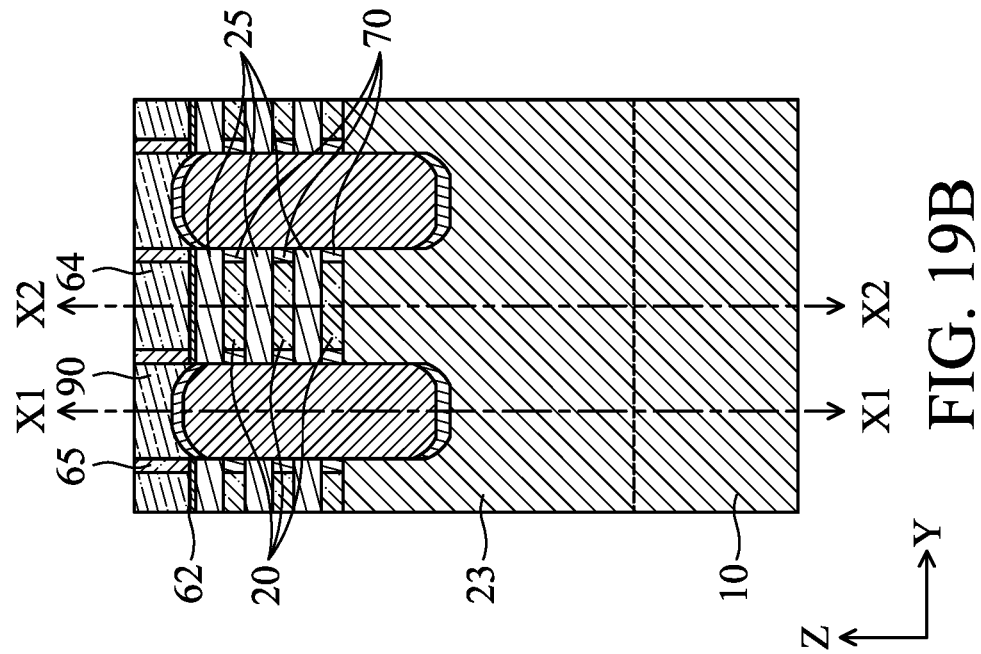
FIGS. 19A, 19B and 19C show various views of one of the various stages of manufacturing a semiconductor GAA FET device according to an embodiment of the present disclosure.
Figure 19A:
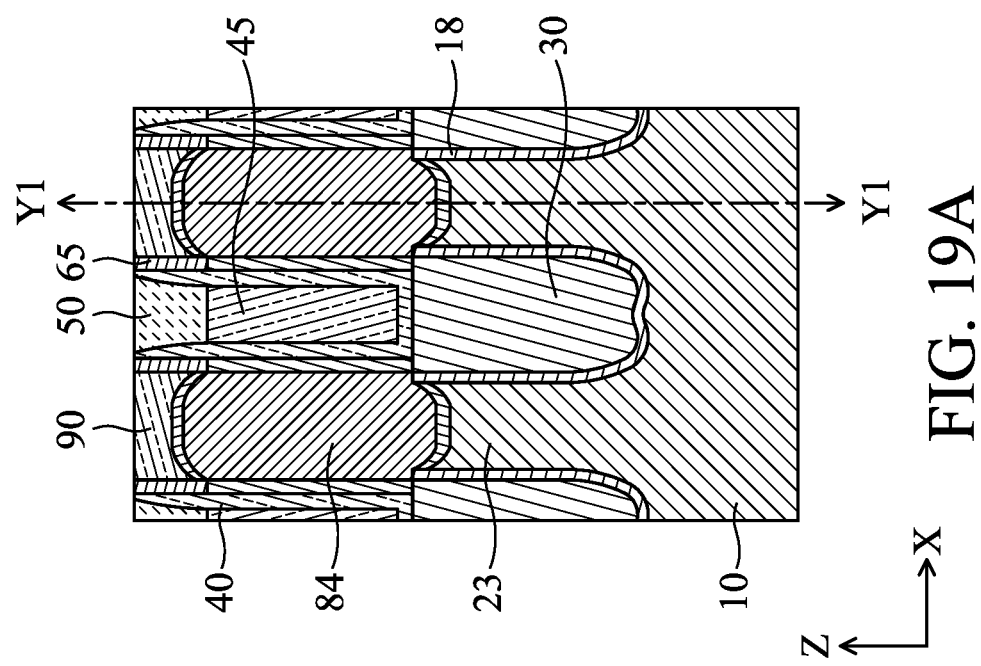
Figure 19C:
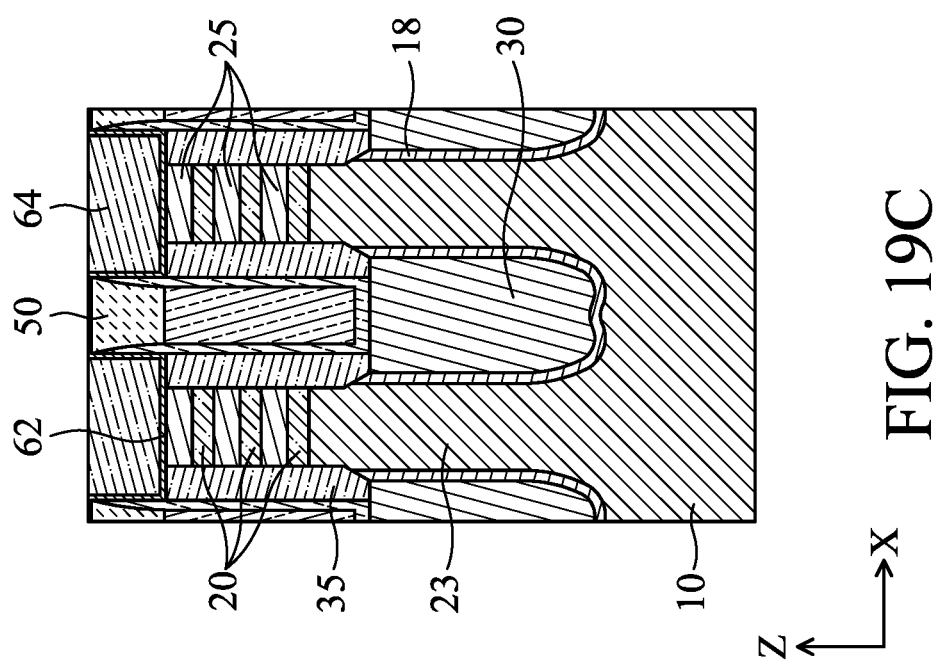

After the source/drain epitaxial layers are formed, a fifth dielectric layer 90 is formed over the source/drain epitaxial layers, as shown in FIGS. 19A-19C. The fifth dielectric layer 90 includes one of silicon nitride and silicon oxide, SiON, SiOC, SiCN and SiOCN, or any other suitable dielectric material. Then, one or more planarization operations, such as a CMP operation, are performed to expose the upper surface of the sacrificial gate electrode 64 as shown in FIGS. 19B and 19C.

Figure 20C:
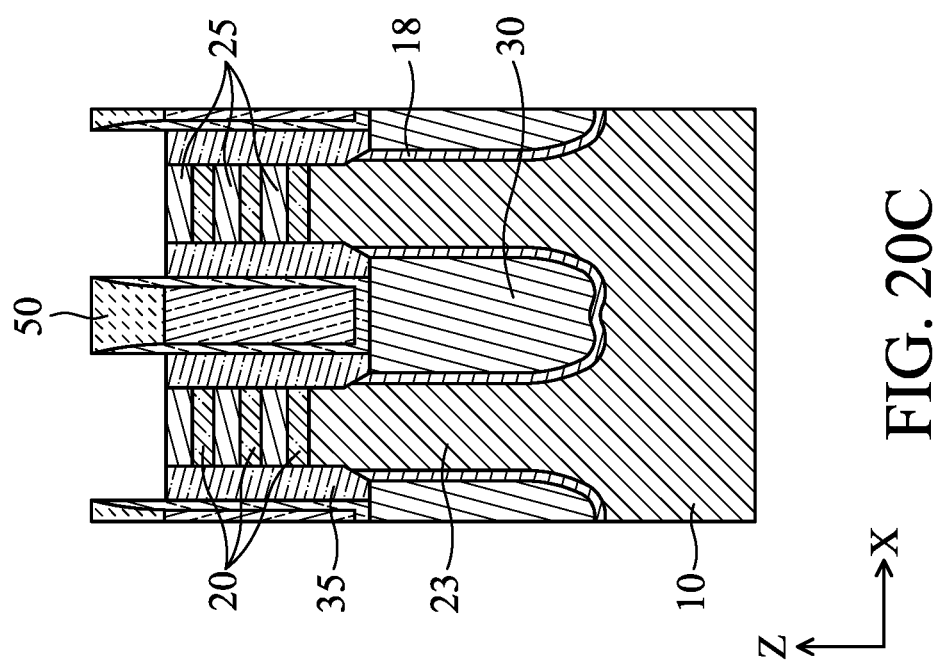

Then, the sacrificial gate electrode 64 and sacrificial gate dielectric layer 62 are removed as shown in FIGS. 20A-20C. The fifth dielectric layer 90 protects the source/drain epitaxial layers during the removal of the sacrificial gate structures. The sacrificial gate structures can be removed using plasma dry etching and/or wet etching. When the sacrificial gate electrode 64 is polysilicon, a wet etchant such as a TMAH solution can be used to selectively remove the sacrificial gate electrode 64. The sacrificial gate dielectric layer 62 is thereafter removed using plasma dry etching and/or wet etching.

Figure 21B:
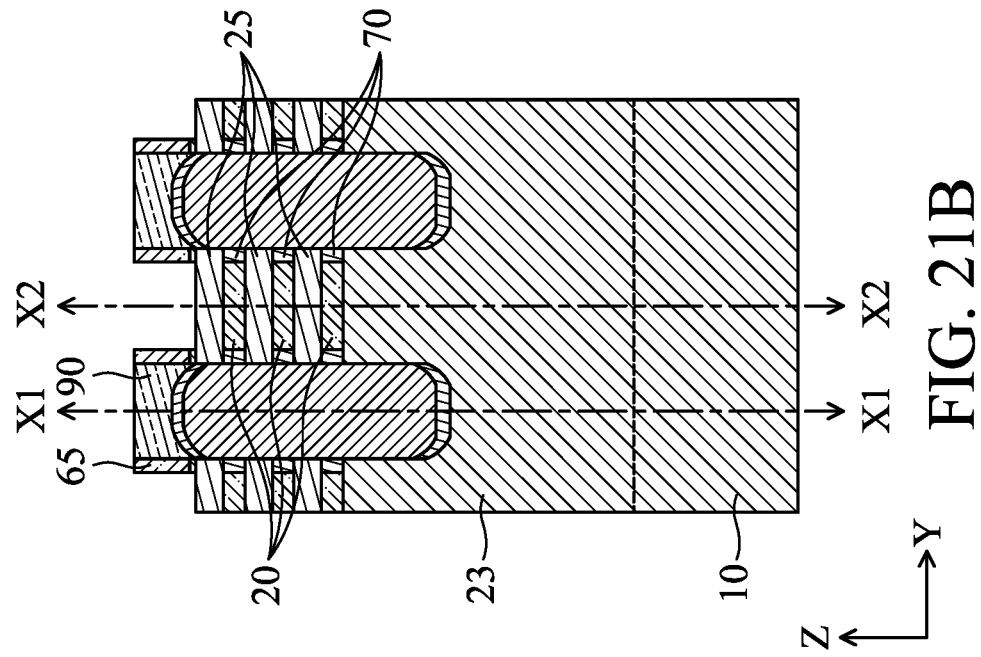
FIGS. 21A, 21B and 21C show various views of one of the various stages of manufacturing a semiconductor GAA FET device according to an embodiment of the present disclosure.
Figure 21A:
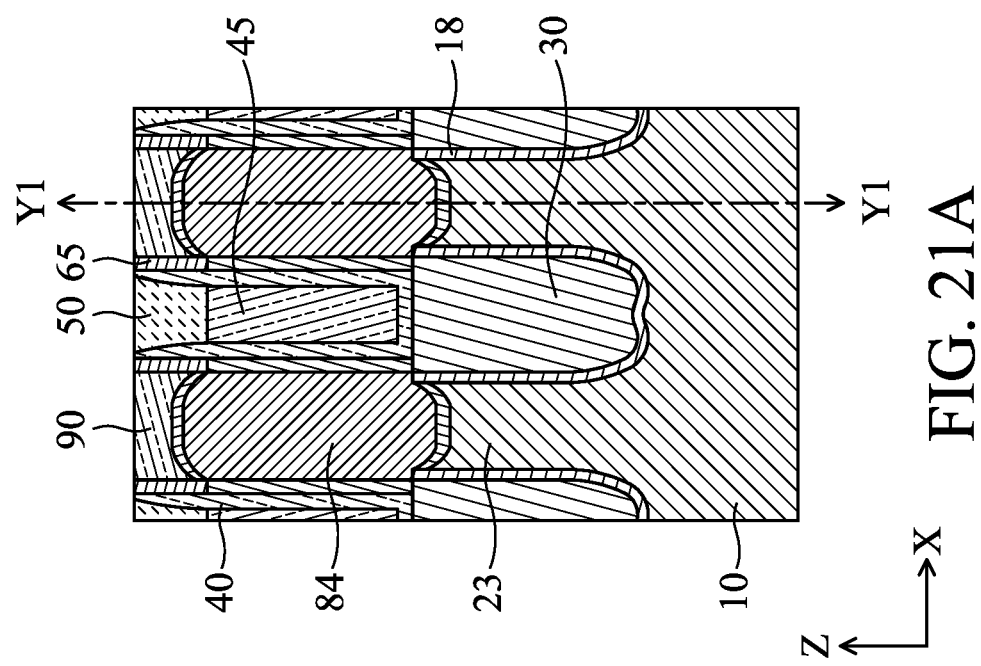
Figure 21C:
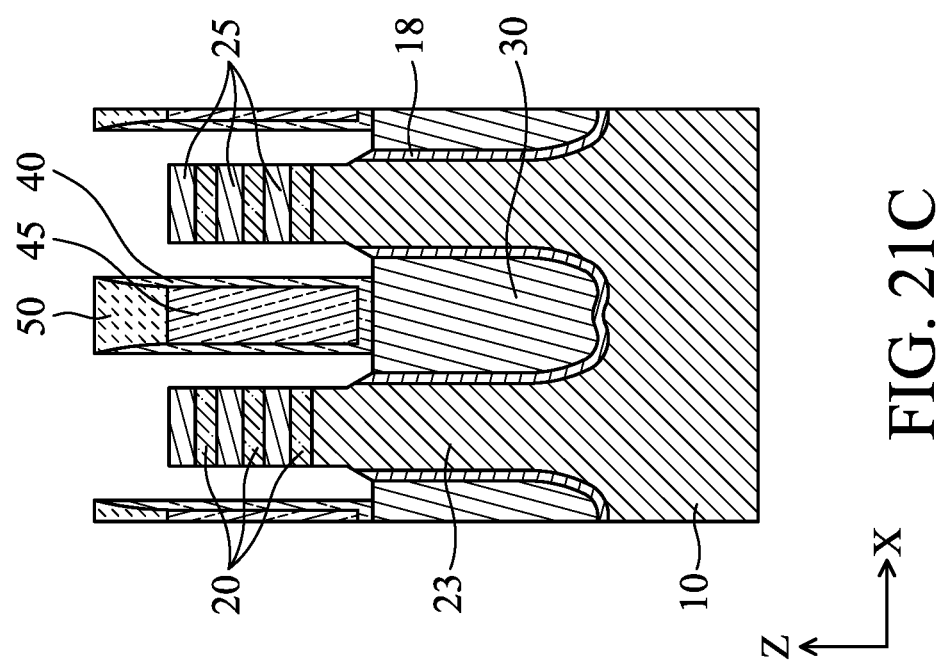

After the sacrificial gate structures are removed, the sacrificial cladding layer 35 is removed by one or more dry and/or wet etching operations, as shown in FIGS. 21A-21C.

Then, the first semiconductor layers 20 are removed, thereby forming wires or sheets, or semiconductor nanobodies (channel regions) of the second semiconductor layers 25, as shown in FIGS. 22A-22D. FIG. 22D is a top (plan) view. The first semiconductor layers 20 can be removed or etched using an etchant that can selectively etch the first semiconductor layers 20 against the second semiconductor layers 25. As shown in FIG. 22B, since the inner spacers 70 are formed, the etching of the first semiconductor layers 20 stops at the inner spacers 70. As shown in FIG. 22D, the sacrificial cladding layer 35 is fully removed in some embodiments.

In some embodiments, the semiconductor device includes a p-type FET and an n-type FET having different source/drain epitaxial layer from each other. In some embodiments, the n-type FET includes an epitaxial layer 84N including SiP, SiAs, SiCP, SiPAs and/or SiC, and the p-type FET includes an epitaxial layer 84P including SiGe, GeSn and/or SiGeSn. As set forth above, the first semiconductor layers 20 and the sacrificial cladding layer 35 may be formed by SiGe. In such a case, if any part of the sacrificial cladding layer 35 made of SiGe is exposed to the source/drain space, when the first semiconductor layers 20 and the sacrificial cladding layer 35 are removed, a part of or all of the p-type epitaxial layer 84P may be removed. However, as set forth above, since no part of the sacrificial cladding layer 35 made of SiGe is exposed to the source/drain space, such a missing epitaxial layer can be avoided.

Figure 23B:
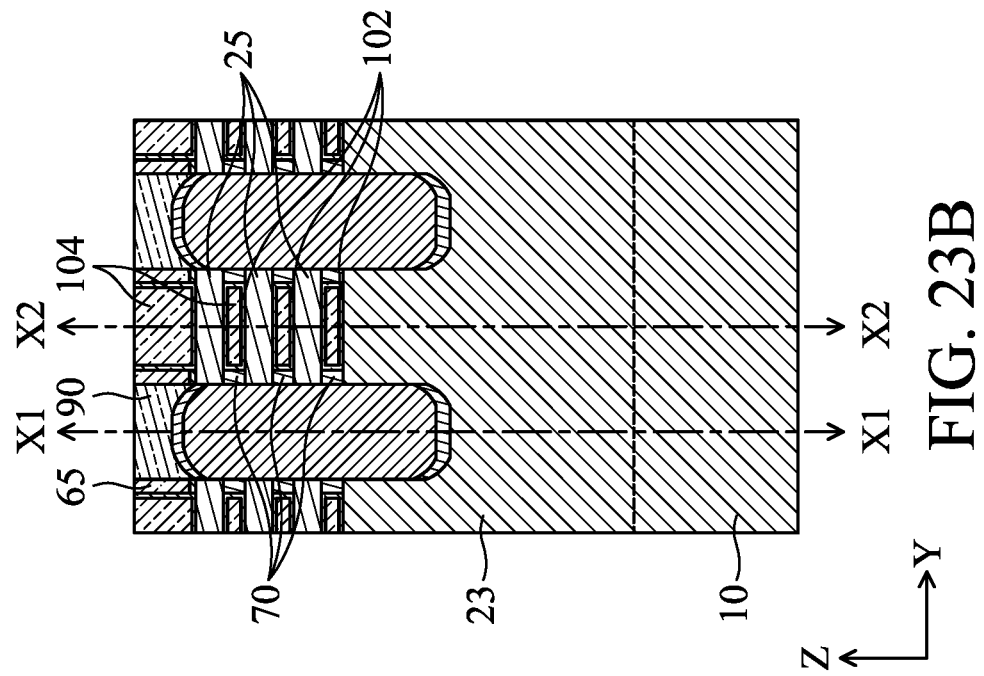
FIGS. 23A, 23B, 23C, 23D and 23E show various views of one of the various stages of manufacturing a semiconductor GAA FET device according to an embodiment of the present disclosure.
Figure 23A:
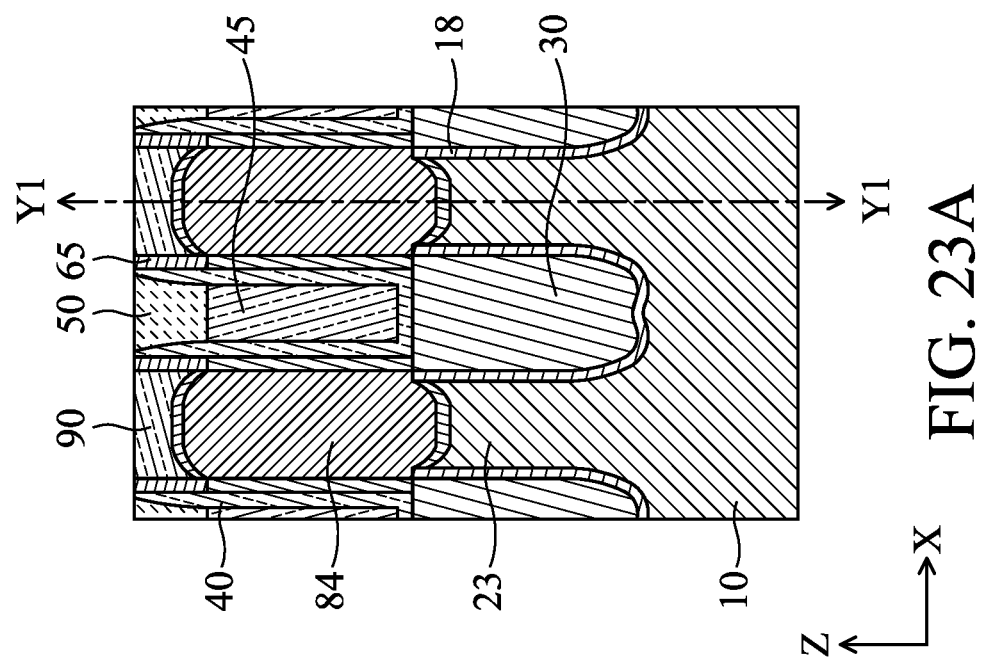
Figure 23D:
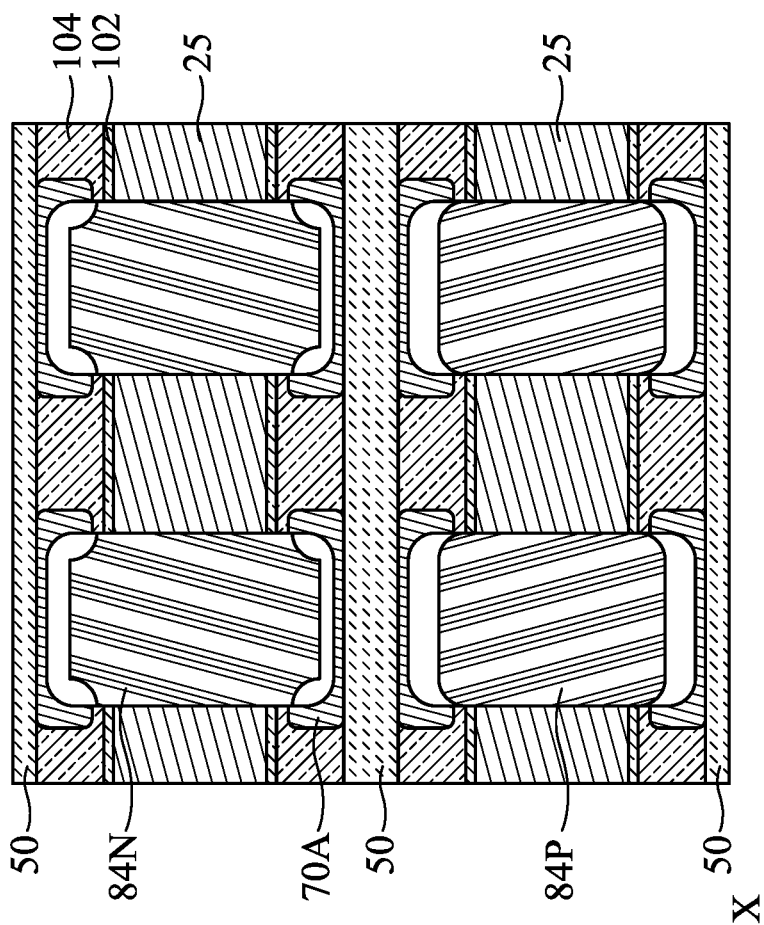
Figure 23C:
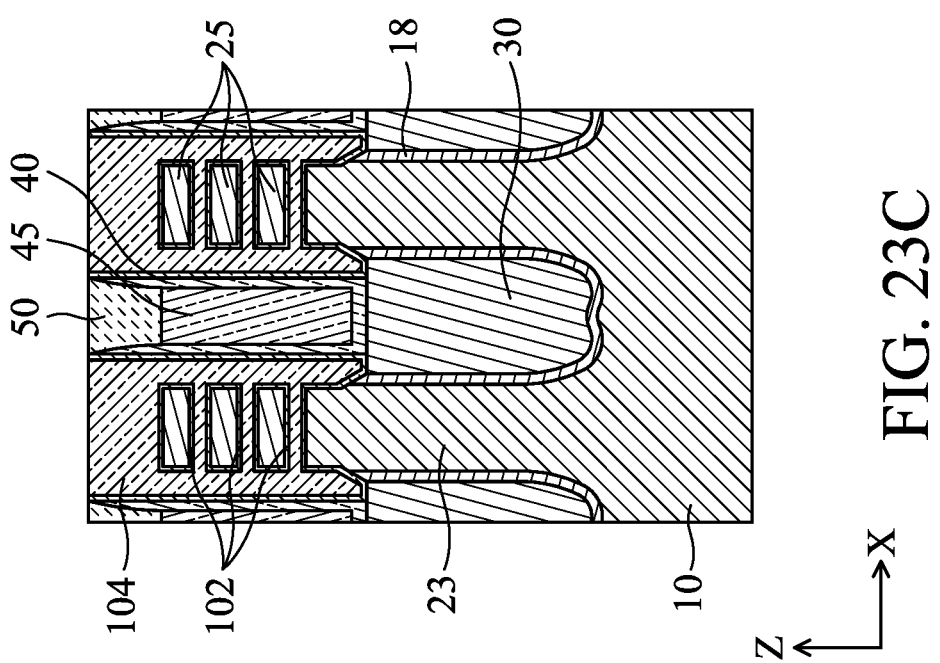
Figure 23E:
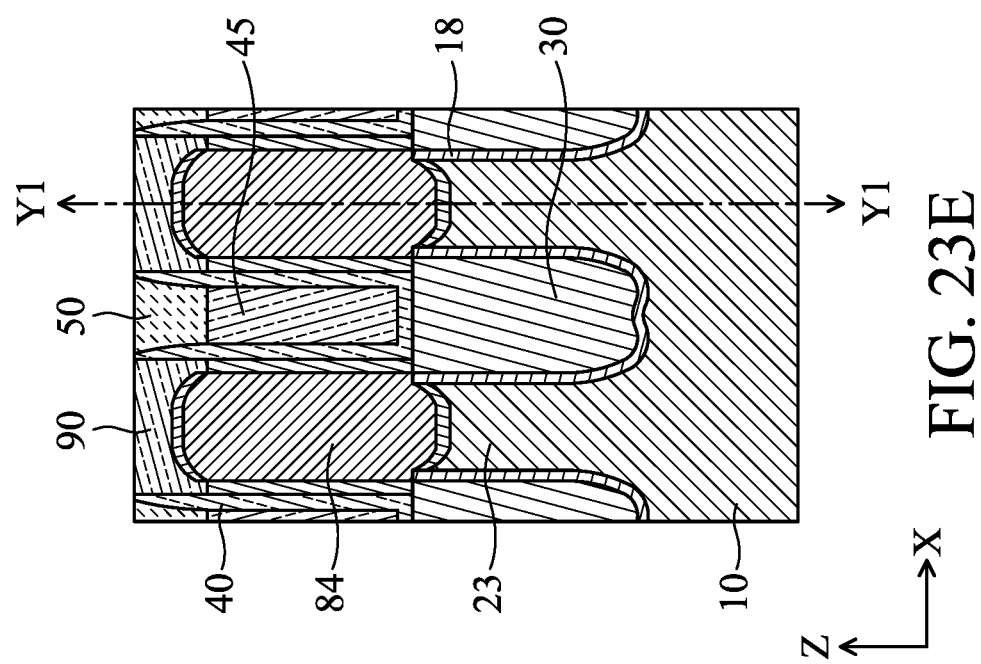
Figure 24C:
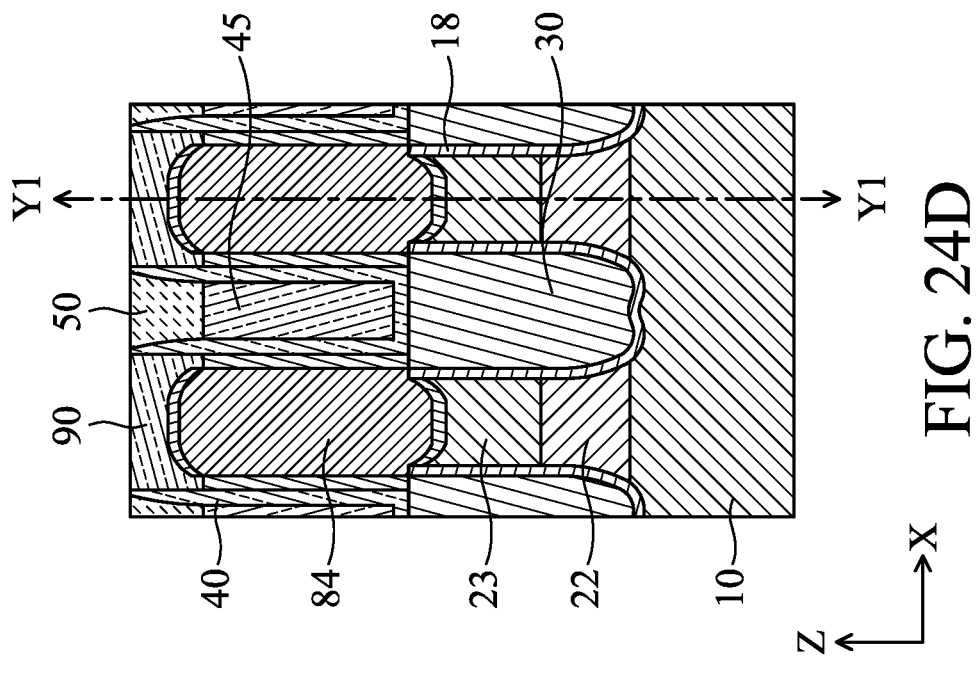
Figure 24D:
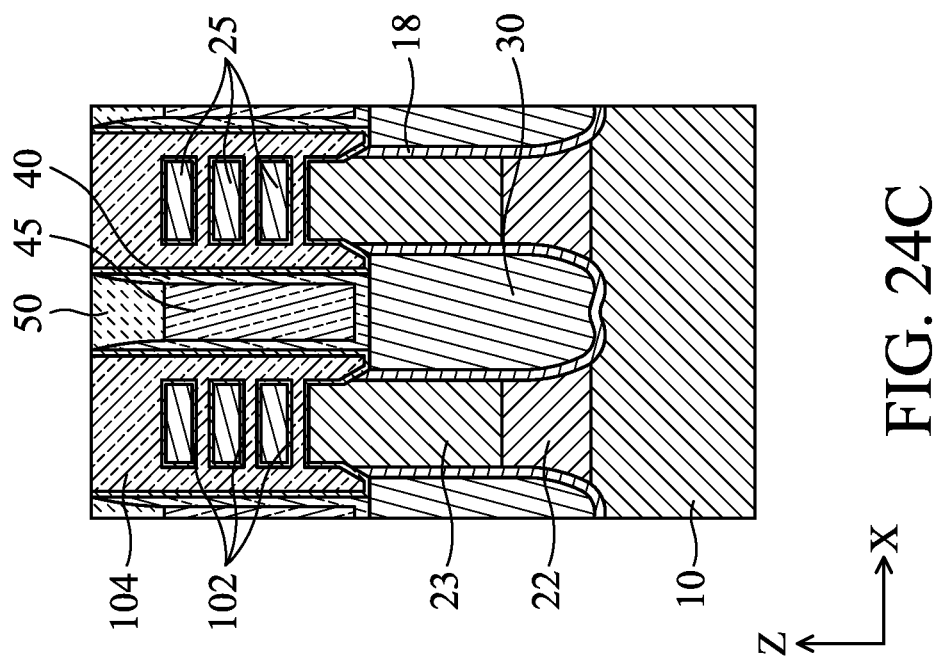

After the semiconductor wires or sheets (channel regions) of the second semiconductor layers 25 are released, a gate dielectric layer 102 is formed around each channel region, and further, a gate electrode layer 104 is formed on the gate dielectric layer 102, as shown in FIGS. 23A-23D. FIG. 23D is a top (plan) view, in which some features/layers are omitted or transparent. In some embodiments, the structure and/or material of the gate electrode for the n-type GAA FET are different from the structure and/or material of the gate electrode for the p-type GAA FET. FIG. 23E shows the structure when no sidewall spacer is formed on sidewalls of the first dielectric layer which is on the third dielectric layer 50.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 102 includes an interfacial layer (not shown) formed between the channel layers and the dielectric material. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate dielectric layer and the gate electrode layer are then planarized by using, for example, CMP, until the top surfaces of the fifth dielectric layer 90 and the third dielectric layer 50 are revealed. In some embodiments, after the planarization operation, the gate electrode layer 104 is recessed and a cap insulating layer (not shown) is formed over the recessed gate electrode 104. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

FIGS. 24A-24D show various views of one of the various stages of manufacturing a semiconductor GAA FET device according to an embodiment of the present disclosure. FIGS. 24A-24D correspond to FIGS. 23A-23C and 23E, respectively, except that the first bottom semiconductor layer 22 is formed in FIGS. 24A-24D.

It is understood that the FET undergoes further CMOS processes to form various features such as contacts/vias, interconnect metal layers, dielectric layers, passivation layers, etc.

As set forth above, the cladding layer 35 (e.g., amorphous SiGe) surrounds the semiconductor nano wires or sheets, and is replaced by work function metals. In some embodiments, when removing the cladding layer 35, a residue (SiGe residue) remains. To avoid the SiGe residue, the profile of cladding SiGe is made as vertical as possible because of the U-shape of global etching profile. In some embodiments, when etching the cladding layer 35, a bottom break through process for the SiGe cladding layer is used to solve the facet issue of crystal cladding SiGe approach. However, the footing profile of cladding amorphous SiGe after the SiGe break through process may cause the SiGe residue from the global etching, and finally may cause epitaxial damage at sheet formation.

In some embodiments, the process according to the present disclosure employs a vertical profile at the bottom of SiGe cladding by using an atomic layer treatment to form a protection layer 36, a necking feature near the bottom cladding SiGe (the side effect of good iso-dense loading) and a smaller top shoulder loss then the facet. These approaches result in avoiding epitaxial damage in the sheet formation (epitaxial layer formation), and improve iso-dense loading effect.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a fin structure is formed. The fin structure includes a stacked layer of first semiconductor layers and second semiconductor layers disposed over a bottom fin structure, and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. An etching operation is performed to remove lateral portions of the sacrificial cladding layer, thereby leaving the sacrificial cladding layer on sidewalls of the exposed hard mask layer and stacked layer. A first dielectric layer is formed, and a second dielectric layer made of a different material than the first dielectric layer is formed over the first dielectric layer. The second dielectric layer is recessed, and a third dielectric layer made of a different material than the second dielectric layer is formed on the recessed second dielectric layer, thereby forming a wall fin structure. During the etching operation, a protection layer is formed over the sacrificial cladding layer. In one or more of the foregoing or following embodiments, the protection layer is an oxide of a material of the sacrificial cladding layer. In one or more of the foregoing or following embodiments, the oxide is formed by treating a surface of the sacrificial cladding layer by one or more of $SO_2$ or $O_2$. In one or more of the foregoing or following embodiments, the treating includes a plasma treatment. In one or more of the foregoing or following embodiments, the protection layer is formed after some part of the sacrificial cladding layer is removed. In one or more of the foregoing or following embodiments, the protection layer is formed before the lateral portions of the sacrificial cladding layer disposed on the isolation insulating layer is fully removed. In one or more of the foregoing or following embodiments, the first semiconductor layers are made of SiGe and the second semiconductor layers are made of Si, and the sacrificial cladding layer is made of SiGe. In one or more of the foregoing or following embodiments, the sacrificial cladding layer is amorphous or polycrystalline. In one or more of the foregoing or following embodiments, the hard mask layer is made of SiGe. In one or more of the foregoing or following embodiments, the first dielectric layer includes at least one of SiOC, SiOCN or SiCN, the second dielectric layer includes at least one of silicon nitride, silicon oxide or SiON, and the third dielectric layer includes at least one of hafnium oxide, zirconium oxide, aluminum oxide or titanium oxide.

In accordance with another aspect of the present disclosure, in a method of manufacturing a semiconductor device, fin structures are formed. Each of the fin structures includes a stacked layer of first semiconductor layers and second semiconductor layers disposed over a bottom fin structure, and a hard mask layer over the stacked layer. An isolation insulating layer is formed so that the hard mask layer and the stacked layer are exposed from the isolation insulating layer. A sacrificial cladding layer is formed over at least sidewalls of the exposed hard mask layer and stacked layer. An etching operation to remove lateral portions of the sacrificial cladding layer is performed, thereby leaving the sacrificial cladding layer on sidewalls of the exposed hard mask layer and stacked layer. During the etching operation, a protection layer is formed over the sacrificial cladding layer. A first dielectric layer is formed such that the first dielectric layer not fully filling a space between the fin structures. A second dielectric layer made of a different material than the first dielectric layer is formed over the first dielectric layer to fully fill the space between the fin structures. The second dielectric layer is recessed. A third dielectric layer made of a different material than the second dielectric layer is formed on the recessed second dielectric layer, thereby forming a wall fin structure. The hard mask layer is removed. A sacrificial gate structure is formed. Sidewall spacers are formed on sidewalls of the sacrificial gate structure and sidewalls of a part of the wall fin structure. A source/drain structure is formed. A fourth dielectric layer is formed. The sacrificial gate structure is removed. The sacrificial cladding layer is removed. The first semiconductor layers are removed. A metal gate structure is formed around the second semiconductor layers. In one or more of the foregoing or following embodiments, the etching operation includes: a breakthrough etching operation; a main etching after the breakthrough etching operation; an atomic layer treatment for forming the protection layer after the main etching operation; and a defooting etching after the atomic layer treatment. In one or more of the foregoing or following embodiments, the atomic layer treatment comprises a plasma treatment using an oxygen containing gas. In one or more of the foregoing or following embodiments, the atomic layer treatment is performed at a temperature in a range from 25° C. to 100° C. In one or more of the foregoing or following embodiments, the main etching operation stops before the lateral portions of the sacrificial cladding layer disposed on the isolation insulating layer is fully removed, and the defooting etching operation fully removes the lateral portions of the sacrificial cladding layer disposed on the isolation insulating layer. In one or more of the foregoing or following embodiments, after the defooting etching operation, a different between a first width between outer faces of the sacrificial cladding layer on sidewalls of the exposed hard mask layer and stacked layer at an interface between the exposed hard mask layer and the exposed stacked layer and a second width between outer faces of the sacrificial cladding layer on sidewalls of the exposed hard mask layer and stacked layer at an interface between the exposed stacked layer and the isolation insulating layer is in a range from 0.5 nm to 1.0 nm, where the second width is greater than the first width. In one or more of the foregoing or following embodiments, the sacrificial cladding layer is made of amorphous SiGe, and the forming the sacrificial cladding layer includes conformally forming a layer for the sacrificial cladding layer over the exposed hard mask layer and stacked layer and on the isolation insulating layer; and removing a part of the layer on a top of the hard mask layer and on the isolation insulating layer. In one or more of the foregoing or following embodiments, the forming the source/drain structure includes recessing source/drain regions of the fin structures; laterally recessing ends of the first semiconductor layers; forming insulating inner spacers on recessed ends of the first semiconductor layers; and forming one or more semiconductor epitaxial layers. During the recessing, at least a part of the sacrificial cladding layer is removed.

In accordance with another aspect of the present disclosure, in a method of manufacturing a semiconductor device, fin structures are formed. Each of the fin structures has a semiconductor fin and a hard mask layer on the semiconductor fin, and an upper portion of each of the semiconductor fins protrudes from an isolation insulating layer. A sacrificial cladding layer is formed over at least sidewalls of the hard mask layer and the upper portion of each of the semiconductor fins. Lateral portions of the sacrificial cladding layer are partially etched. A protection layer is formed on the sacrificial cladding layer. A remaining portion of the lateral portions of the sacrificial cladding layer is removed, thereby leaving the sacrificial cladding layer on sidewalls of the exposed hard mask layer and stacked layer. A first dielectric layer is formed to partially fill a space between the semiconductor fins. A second dielectric layer made of a different material than the first dielectric layer is formed over the first dielectric layer to fully fill the space. The second dielectric layer is recessed. A third dielectric layer made of a different material than the second dielectric layer is formed on the recessed second dielectric layer, thereby forming a wall fin structure between the fin structures. In one or more of the foregoing or following embodiments, the sacrificial cladding layer is made of amorphous or polycrystalline of SiGe, and the protection layer is an oxide of SiGe. In one or more of the foregoing or following embodiments, a thickness of the protection layer is in a range from 1 nm to 5 nm.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a fin structure;
    forming an isolation insulating layer so that an upper portion of the fin structure is exposed from the isolation insulating layer;
    forming a sacrificial cladding layer over the exposed upper portion of the fin structure;
    performing an etching operation to remove lateral portions of the sacrificial cladding layer, thereby leaving the sacrificial cladding layer on sidewalls of the exposed upper portion of the fin structure;
    forming a first dielectric layer over the sacrificial cladding layer;
    forming a second dielectric layer made of a different material than the first dielectric layer over the first dielectric layer;
    recessing the second dielectric layer; and
    forming a third dielectric layer made of a different material than the second dielectric layer on the recessed second dielectric layer, thereby forming a wall fin structure.

2. The method of claim 1, wherein during the etching operation, a protection layer, which is an oxide of a material of the sacrificial cladding layer, is formed over the sacrificial cladding layer.

3. The method of claim 2, wherein the oxide is formed by treating a surface of the sacrificial cladding layer by one or more of $SO_2$ or $O_2$.

4. The method of claim 3, wherein the treating comprises a plasma treatment.

5. The method of claim 2, wherein the protection layer is formed after a portion of the sacrificial cladding layer is removed.

6. The method of claim 5, wherein the protection layer is formed before the lateral portions of the sacrificial cladding layer disposed on the isolation insulating layer are fully removed.

7. The method of claim 1, wherein the sacrificial cladding layer is made of SiGe.

8. The method of claim 7, wherein the sacrificial cladding layer is amorphous or polycrystalline.

9. A method of manufacturing a semiconductor device, comprising:
    forming fin structures each including a stacked layer of first semiconductor layers and second semiconductor layers disposed over a bottom fin structure and a hard mask layer over the stacked layer;
    forming an isolation insulating layer so that the hard mask layer and the stacked layer are exposed from the isolation insulating layer;
    forming a sacrificial cladding layer over the exposed hard mask layer and stacked layer;
    performing an etching operation to remove lateral portions of the sacrificial cladding layer, thereby leaving the sacrificial cladding layer on sidewalls of the exposed hard mask layer and stacked layer, wherein during the etching operation, a protection layer is formed over the sacrificial cladding layer;
    forming a wall fin structure between the fin structures;
    removing the hard mask layer;
    forming a sacrificial gate structure over the fin structures;

forming sidewall spacers on sidewalls of the sacrificial gate structure and sidewalls of a part of the wall fin structure;
forming a source/drain structure over the fin structures adjacent the sidewall spacers;
forming a dielectric layer over the source/drain structure;
removing the sacrificial gate structure;
removing the sacrificial cladding layer;
removing the first semiconductor layers; and
forming a metal gate structure around the second semiconductor layers.

10. The method of claim 9, wherein the sacrificial cladding layer is made of SiGe.

11. The method of claim 9, wherein the etching operation comprises:
a breakthrough etching operation;
a main etching operation after the breakthrough etching operation;
an atomic layer treatment for forming the protection layer after the main etching operation; and
a defooting etching operation after the atomic layer treatment.

12. The method of claim 11, wherein the atomic layer treatment comprises a plasma treatment using an oxygen containing gas.

13. The method of claim 12, wherein the atomic layer treatment is performed at a temperature in a range from 25° C. to 100° C.

14. The method of claim 11, wherein:
the main etching operation stops before the lateral portions of the sacrificial cladding layer disposed on the isolation insulating layer are fully removed, and
the defooting etching operation fully removes the lateral portions of the sacrificial cladding layer disposed on the isolation insulating layer.

15. The method of claim 14, wherein after the defooting etching operation, a difference between a first width between outer faces of the sacrificial cladding layer on sidewalls of the exposed hard mask layer and stacked layer at an interface between the exposed hard mask layer and the exposed stacked layer and a second width between outer faces of the sacrificial cladding layer on sidewalls of the exposed hard mask layer and stacked layer at an interface between the exposed stacked layer and the isolation insulating layer is in a range from 0.5 nm to 1.0 nm, where the second width is greater than the first width.

16. The method of claim 11, wherein:
the sacrificial cladding layer is made of amorphous SiGe, and
the forming the sacrificial cladding layer comprises:
conformally forming a layer for the sacrificial cladding layer over the exposed hard mask layer and stacked layer and on the isolation insulating layer; and
removing a part of the layer on a top of the hard mask layer and on the isolation insulating layer.

17. The method of claim 11, wherein:
the forming the source/drain structure comprises:
recessing source/drain regions of the fin structures;
laterally recessing ends of the first semiconductor layers; and
forming insulating inner spacers on recessed ends of the first semiconductor layers; and
forming one or more semiconductor epitaxial layers, and
during the recessing, at least a part of the sacrificial cladding layer is removed.

18. A method of manufacturing a semiconductor device, comprising:
forming a fin structure;
forming an isolation insulating layer so that an upper portion of the fin structure is exposed from the isolation insulating layer;
forming a sacrificial cladding layer over the exposed upper portion of the fin structure;
partially etching lateral portions of the sacrificial cladding layer;
forming a protection layer over the sacrificial cladding layer; and
removing a further portion of the lateral portions of the sacrificial cladding layer, thereby leaving the sacrificial cladding layer on sidewalls of a hard mask layer and the fin structure.

19. The method of claim 18, wherein:
the sacrificial cladding layer is made of amorphous or polycrystalline of SiGe, and
the protection layer is an oxide of SiGe.

20. The method of claim 18, wherein a thickness of the protection layer is in a range from 1 nm to 5 nm.

* * * * *